(12) United States Patent
Shizukuishi

(10) Patent No.: US 7,742,088 B2
(45) Date of Patent: Jun. 22, 2010

(54) IMAGE SENSOR AND DIGITAL CAMERA

(75) Inventor: Makoto Shizukuishi, Miyagi (JP)

(73) Assignee: Fujifilm Corporation, Tokyo (JP)

(*) Notice: Subject to any disclaimer, the term of this patent is extended or adjusted under 35 U.S.C. 154(b) by 1120 days.

(21) Appl. No.: 10/715,476

(22) Filed: Nov. 19, 2003

(65) Prior Publication Data

US 2004/0100570 A1    May 27, 2004

(30) Foreign Application Priority Data

Nov. 19, 2002 (JP) .............................. 2002-335193
Dec. 2, 2002 (JP) .............................. 2002-349921

(51) Int. Cl.
*H04N 3/14* (2006.01)
*H04N 9/07* (2006.01)

(52) U.S. Cl. ..................... 348/272; 348/273; 348/266

(58) Field of Classification Search ................ 348/272, 348/266, 271, 273, 277, 279, 280, 264
See application file for complete search history.

(56) References Cited

U.S. PATENT DOCUMENTS

| | | | |
|---|---|---|---|
| 3,971,065 A | | 7/1976 | Bayer |
| 4,438,455 A | | 3/1984 | Tabei |
| 5,063,439 A | | 11/1991 | Tabei |
| 5,289,269 A | * | 2/1994 | Sugimori et al. ............. 348/264 |
| 5,614,950 A | | 3/1997 | Park et al. |
| 5,786,588 A | * | 7/1998 | Takahashi ................ 250/208.1 |
| 5,965,875 A | | 10/1999 | Merrill |
| 6,046,466 A | * | 4/2000 | Ishida et al. ................ 257/258 |
| 6,333,760 B1 | * | 12/2001 | Terui et al. ................... 348/315 |
| 6,337,713 B1 | * | 1/2002 | Sato ............................ 348/311 |
| 6,795,120 B2 | * | 9/2004 | Takagi et al. ................. 348/294 |
| 6,829,008 B1 | * | 12/2004 | Kondo et al. ................ 348/302 |
| 6,933,972 B2 | * | 8/2005 | Suzuki et al. ................ 348/302 |
| 7,139,028 B2 | * | 11/2006 | Itano et al. ................... 348/340 |
| 2003/0063204 A1 | * | 4/2003 | Suda ........................... 348/272 |

FOREIGN PATENT DOCUMENTS

| | | |
|---|---|---|
| JP | 61-101185 A | 5/1986 |
| JP | 61-265534 A | 11/1986 |
| JP | 1-134966 | 5/1989 |

(Continued)

OTHER PUBLICATIONS

Gary et al., *IEEE Transactions on Electron Devices*, vol. ED-15, No. 1, Jan. 1968, pp. 30-39.

(Continued)

*Primary Examiner*—Lin Ye
*Assistant Examiner*—Amy Hsu
(74) *Attorney, Agent, or Firm*—Birch, Stewart, Kolasch & Birch, LLP

(57) ABSTRACT

A color solid-state image pickup device includes a plurality of photoelectric conversion areas provided in an array pattern on a surface of a semiconductor substrate. The inside of each of photoelectric conversion areas 10 is two-dimensionally partitioned into a plurality of segments R, G1, G2, and B which output a plurality of photoelectric conversion signals of different spectral sensitivities. As a result, occurrence of a false signal and a false color is suppressed, and high-sensitivity, high-resolution image data having superior color reproducibility can be obtained.

49 Claims, 29 Drawing Sheets

FOREIGN PATENT DOCUMENTS

| | | |
|---|---|---|
| JP | 4-170849 A | 6/1992 |
| JP | 5-243543 A | 9/1993 |
| JP | 8-182005 A | 7/1996 |
| JP | 9-64329 A | 3/1997 |
| JP | 2001-245309 A | 9/2001 |
| JP | 2001-250931 A | 9/2001 |
| JP | 2001-339056 A | 12/2001 |
| JP | 2002-151670 A | 5/2002 |
| JP | 2002-270811 A | 9/2002 |

OTHER PUBLICATIONS

Yamada et al., *IEEE Journal of Solid-State Circuits*, vol. 35, No. 12, Dec. 2000.

* cited by examiner

US 7,742,088 B2

IMAGE SENSOR AND DIGITAL CAMERA

This nonprovisional application claims priority under 35 U.S.C. §119(a) on Patent Application No. 2002-335193 filed in JAPAN on Nov. 19, 2002 and Patent Application No. 2002-349921 filed in JAPAN on Dec. 2, 2002, the entire contents of which are hereby incorporated by reference.

BACKGROUND OF THE INVENTION

1. Field of the Invention

The invention relates to a color solid-state image pickup device of single chip type and to a digital camera equipped with the color solid-state image pickup device.

2. Description of the Related Art

A typical color representation means employed in a solid-state image pickup device such as a CCD or CMOS types consisting of color representation means (i.e., a color solid-state image pickup device of single chip type) in which micro-color filters having three or four different spectral characteristics are arranged, in a mosaic pattern, on respective photodiodes (pixels) arranged on the surface of an image pickup element in the form of a two-dimensional array.

FIG. 38A is a conceptual plan view of the CMOS image sensor of single chip type as a related-art. A known image sensor 101 has a plurality of photodiodes 102 arranged on the surface of the sensor in a two-dimensional arrayed pattern. Micro-color filters having three or four different spectral characteristics (micro-color filters of primary colors, e.g., R, G, and B) are arranged, in a mosaic pattern, on the surfaces of the respective photodiodes 102.

The micro-color filters are roughly classified into two types: that is, primary colors (R, G, B) and complementary colors (G, Ye, Cy, Mg). According to a method of arrangement, a stripe pattern and a Bayer pattern such as disclosed in U.S. Pat. No. 3,971,065 or U.S. Pat. No. 5,063,439 are proposed. However, the photodiodes are discretely spread over a two-dimensional plane, and the respective photodiodes correspond to any of three or four types of different spectral sensitivities. Hence, the following problem arises.

(1) When an image having a spatial frequency higher than the Nyquist frequency determined by a pitch between the photodiodes is projected on a color solid-state image pickup device, the high spatial frequency component is folded toward a low-frequency range, thereby resulting in generation of a false signal called aliasing or a Moiré and deteriorating the quality of a photographed image.

(2) Color filters having different spectral sensitivities correspond to different locations on a two-dimensional plane. Nyquist domains (i.e., spatial frequency distributions) of respective colors fail to coincide with each other by means of distribution patterns of respective color filters. Consequently, a phenomenon called a false color or a color Moiré is induced, thereby deteriorating the quality of the photographed image.

For these reasons, as a method for lessening Moiré, there has hitherto been adopted a method for inserting an optical low-pass filter (OLPF) between a light-gathering optical system (i.e., a lens system) and the image sensor. Use of this method enables attenuation of a high spatial frequency component, thereby improving Moiré.

However, the effect of improving Moiré by use of the optical low-pass filter is insufficient. The optical low-pass filter is constituted by combination of birefringent optical materials, such as quartz plates. A structure in which an optical low-pass filter is attached to a package for protecting an image sensor suffers a problem of a hike in manufacturing costs as well as a problem of the optical low-pass filter being likely to be broken by mechanical stress inflicted on the package.

Meanwhile, a recent image sensor has undergone miniaturization of a photodiode; i.e., an increase in the number of pixels. Hence, the resolution of the image pickup device has been improved by leaps and bounds. The Nyquist frequency is also made higher as a result of miniaturization of the pitch between photodiodes. Therefore, in principle, occurrence of Moiré tends to be inhibited.

However, in order to integrate a plurality of photodiodes such as millions of pixels on one chip, other problems have come up as follows.

First, in association with miniaturization of the photodiode, a microlens must also be miniaturized. In this case, the relative thickness of the microlens becomes larger, thereby shortening the focal length of the microlens. As a result, focus is achieved at an elevated point forward of a photodiode. In order to adjust the focal length, another lens (inter-layer lens) must be formed into a lower portion of the microlens. Formation of another lens makes the structure of the microlens complicated, thereby posing difficulty in achieving stable manufacturing yield.

A light-shielding film having apertures is stacked over photodiodes and peripheral circuits thereof such that apertures come to positions above the respective photodiodes. FIG. 38B is a plan view showing a light-shielding film for four pixels denoted by broken lines "b" shown in FIG. 38A. The light-shielding film 103 has the apertures 103a corresponding to the respective photodiodes 102. The apertures 3a formed in the light-shielding film 103 are miniaturized in association with miniaturization of the photodiodes. When the aperture has a size of, e.g., 1 μm or less, the intensity of incident light is greatly attenuated when the incident light passes through the aperture, depending on the wavelength of the light. For example, red (R) light has a wavelength of about 0.650 μm. Hence, when the aperture has a size of 1 μm or less, wave optical effects must be taken into consideration.

Therefore, when an attempt is made to miniaturize the photodiodes remaining in a related-art arrangement; that is, dispersed on a per-color basis, miniaturization of photodiodes and a read circuit, which are to be fabricated on a semiconductor substrate, and miniaturization of an on-chip light-gathering optical system (e.g., microlenses, color filters, and apertures of a light-shielding film) simultaneously become indispensable. The intensity of the light entering a light-receiving section is significantly decreased by means of the wave optical effect. Even if an image of a bright object is captured, a problem of insufficient sensitivity will arise.

FIG. 39A is a cross-sectional view of a related-art CMOS image sensor. A photodiode 102 is fabricated on the surface of a semiconductor substrate. Light-shielding films 103 are formed at positions above the photodiodes 102. Color filters 104, such as R, G, and B color filters, are formed at positions above the light-shielding films 103. Microlenses (top lenses) 105 are formed on the color filters 104. Peripheral circuit sections 196 are provided beside the respective photodiodes 102, and the peripheral circuit sections 196 are shielded by the light-shielding films 103.

FIG. 39B shows an equivalent circuit of one photodiode and a peripheral circuit thereof. The photodiode 102 is connected to a transistor 196a constituting a source follower amplifier and to a transistor 196b constituting a reset gate. These transistors 196a, 196b are fabricated around the photodiode 102.

In the case of a CMOS image sensor, wiring electrodes provided for each photodiode 102, such as an X address line, a Y address line, a power line, and a reset signal line, must be formed in positions which are located above the photodiode 102 and avoid a light-receiving surface of the photodiode 102. Therefore, the wiring electrodes are laid in a grid pattern so as to avoid respective light-receiving surfaces of the photodiodes.

Laying all the wiring electrodes within a single plane while preventing electrical contact is not possible. In an illustrated example, signal lines are arranged in a three-layer structure as indicated by means of signal lines 106, 107, and 108. The signal lines 106, 107, and 108 are isolated from each other by means of an interlayer insulation film. Hence, a distance "a" between the surface of the photodiode 102 and the top lens 105 eventually becomes longer. Even when an increase in the number of pixels is pursued, the distance "a" cannot be shortened. Hence, the light entering the microlenses 105 reaches the respective photodiodes 102 while passing through narrower channels in the case of an image sensor for which an attempt has been made to increase the number of pixels.

Next, there occurs a phenomenon in which a difference arises between the center of a light-receiving area and a peripheral area of the CMOS image sensor in terms of sensitivity and color reproducibility. The phenomenon is a socalled (brightness, color) shading phenomenon. In particular, as the light-gathering optical (i.e., a camera lens) system is miniaturized and, eventually, the focal length becomes shorter, sensitivity variations, which are attributable to an increase in difference between the center and neighborhood of the light-receiving area and surroundings of the same in terms of incident angle of the incident light, cannot become negligible.

The following manners are proposed for solving this problem.

(1) The arrangement of the microlens 105 is displaced toward the center by a predetermined amount with increasing proximity to the peripheral area of the image sensor.

(2) Another microlens (i.e., an in-layer lens) is provided below the microlens 105 (also called a "top lens"). The light gathered by the top lens is again positioned and converged on the respective photodiodes through use of the in-layer lens.

(3) Sensitivity variations are electrically corrected by a peripheral signal processing circuit (external circuit).

In association with miniaturization of the photodiodes, the improvement means described in (1), (2) encounter difficulty in controlling the shape of a highly accurate microlens and the arrangement of the microlenses. Hence, adoption of the improvement means (1), (2) has been difficult. In the case of the CMOS image sensor, presence of multilayer wiring sections 106, 107, and 108 and the interlayer insulation film poses extreme difficulty in forming an in-layer lens. Moreover, in relation to all the countermeasures (1), (2), and (3), if a difference arises in a lens system (e.g., a difference between a lens system of a digital still camera and a lens system of a built-in camera of a portable cellular phone), the appearance of a shading phenomenon also changes. This requires each image pickup system for a certain design change before said improvement means are applied.

In relation to the related-art color solid-state image pickup device involving these problems, such as disclosed in U.S. Pat. Nos. 5,965,875, 4,438,455, or JP-A Hei 1-134966, proposes a CMOS image sensor, wherein a photodiode for detecting a blue color, a photodiode for detecting a green color, and a photodiode for detecting a red color are formed so as to overlap each other in a depthwise direction of a semiconductor substrate. The CMOS image sensor utilizes a principle described in "A Planar Silicon Photosensor with an Optimal Spectral Response for Detecting Printed Material" written by Paul A. Gary and John G. Linvill, IEEE Transactions on Electronic Devices, Vol. Ed-15, No. 1, January 1968; that is, the principle of the photoelectric conversion characteristics of respective photodiodes having wavelength dependency (spectral sensitivity) depending on the depth of a p-n junction of each photodiode from the surface of a semiconductor substrate.

The CMOS image sensor, such as disclosed in U.S. Pat. No. 5,965,875, utilizes a correlation existing between absorption of light in a depthwise direction of each pixel or photodiode and the wavelength of visible light. The Nyquist domain does not change according to the colors (R, G, and B). Hence, a false color or color Moiré is considered less likely to arise.

However, spectra of respective color components are determined by wavelength dependence of photoelectric conversion efficiency with reference to the depth of the light having entered the silicon substrate. Further, ohmic contacts are provided for photodiode structures compatible with the light rays of different wavelengths, thereby reading an electric signal directly outside. As a result, there arises a problem of a relative decrease arising in the area of the light-receiving section of the photodiode. Moreover, there also arises a problem of a necessity for laying multilayer metal wiring on the surface of the image pickup element in the X and Y directions.

SUMMARY OF THE INVENTION

The invention aims for providing an inexpensive color solid-state image pickup device of single chip type which suppresses occurrence of a false signal (aliasing or Moiré and a false color and enables high-sensitivity, high-resolution, and faithful color reproduction.

The invention provides a color solid-state image pickup device including a plurality of photoelectric conversion areas provided in an array pattern on a surface of a semiconductor substrate, wherein the inside of each of the photoelectric conversion areas is two-dimensionally partitioned into a plurality of segments which output a plurality of photoelectric conversion signals of different spectral sensitivities.

By means of the foregoing configuration, segments having different spectral sensitivities are closely arranged on a two-dimensional surface. As a result, occurrence of a false signal and a false color is suppressed, and high-sensitivity, high-resolution image data having superior color reproducibility can be obtained. Moreover, the color solid-state image pickup device can be manufactured with high production yield.

The invention also provides a color solid-state image pickup device including a plurality of photoelectric conversion areas provided in an array pattern on a surface of a semiconductor substrate, wherein the inside of each of the photoelectric conversion areas is two-dimensionally partitioned into a plurality of segments which store signal electric charges of different spectral sensitivities, and transfer channels are formed beside the photoelectric conversion areas for transferring the signal electric charges read from a plurality of the segments.

By means of the foregoing configuration, segments having different spectral sensitivities are closely arranged on a two-dimensional surface. As a result, occurrence of a false signal and a false color is suppressed, and high-sensitivity, high-resolution image data having superior color reproducibility can be obtained. Moreover, the color solid-state image pickup device can be manufactured with high production yield.

Further, the surface of the semiconductor substrate of the color solid-state image pickup device of the invention is covered with a light-shielding film having apertures corresponding to the respective photoelectric conversion areas.

By means of the configuration, even when an attempt is made to miniaturize the segments, the apertures of the light-shielding film can be made larger than the wavelength of the incident light. Manufacture of the light-shielding film and the microlens is facilitated, thereby enabling photographing of an image having superior sensitivity.

The color solid-state image pickup device of the invention is further characterized in that the diameter or diagonal dimension of the aperture is larger than the wavelength of incident light and smaller than the diameter or diagonal dimension of the photoelectric conversion area.

By means of the configuration, incident light easily reaches the photoelectric conversion section of each segment, thereby enabling production of an image signal having high sensitivity.

The color solid-state image pickup device of the invention is further characterized in that the spectral sensitivity of at least one segment is determined by a color filter provided at a position above the segment.

By means of the configuration, setting of spectral sensitivity becomes easy, thereby facilitating acquisition of a desired spectral characteristic.

The color solid-state image pickup device of the invention is further characterized in that the spectral sensitivity of at least one segment of the photoelectric conversion area is determined by the distribution of impurities in a depthwise direction of the segment.

By means of such a configuration, a color solid-state image pickup device can be fabricated without use of color filters.

Further, the color solid-state image pickup device of the invention is characterized in that the spectral sensitivity of at least one segment is determined by a color filter provided at a position above the segment as well as by the distribution of impurities in a depthwise direction of the segment.

By means of such a configuration, there is utilized a spectral characteristic made by combination of a spectral characteristic of a color filter with a spectral characteristic determined by the distribution of impurities. The spectral characteristic of the segment using a color filter is improved, whereby the color reproducibility of a color image photographed by the color solid-state image pickup device is enhanced.

The color solid-state image pickup device of the invention is further characterized in that the segment has a p-well layer provided in an n-type semiconductor substrate and an n-type impurity layer formed in the p-well layer, and the spectral sensitivity of the segment is determined by changing the depth of the p-well layer and the depth of the n-type impurity layer.

By means of the configuration, segments having different spectral sensitivities can be formed without use of color filters, thereby simplifying manufacturing processes and improving manufacturing yield.

The color solid-state image pickup device of the invention is further characterized in that a p-well layer of the segment having blue spectral sensitivity, a p-well layer of the segment having green spectral sensitivity, and a p-well layer of the segment having red spectral sensitivity are formed so as to become progressively deeper, in this sequence.

By means of such a configuration, optical electric charges produced by light at long-wave ranges of respective spectral sensitivities flow into the substrate, thereby attenuating the long-wave sides of the respective spectral characteristics.

The color solid-state image pickup device of the invention is further characterized in that an n-type impurity layer provided in the p-well layer of the segment having blue spectral sensitivity, an n-type impurity layer provided in the p-well layer of the segment having green spectral sensitivity, and an n-type impurity layer provided in the p-well layer of the segment having red spectral sensitivity are formed so as to become progressively deeper, in this sequence.

By means of such a configuration, the light entering the semiconductor substrate of the color solid-state image pickup device can be distinguishably detected and detected by a wavelength; i.e., the depth to which the light has entered the semiconductor substrate.

The color solid-state image pickup device of the invention is further characterized in that each of the photoelectric conversion areas is two-dimensionally partitioned into at least three segments; that is, a segment having red spectral sensitivity, a segment having green spectral sensitivity, and a segment having blue spectral sensitivity.

By means of such a configuration, photograph image data formed from primary-color-based color signals can be read from the color solid-state image pickup device.

The color solid-state image pickup device of the invention is further characterized in that each of the photoelectric conversion areas is two-dimensionally partitioned into at least four segments; that is, a segment having yellow spectral sensitivity, a segment having cyan spectral sensitivity, a segment having magenta spectral sensitivity, and a segment having green spectral sensitivity.

By means of such a configuration, photograph image data formed from complementary-color-based color signals can be read from the color solid-state image pickup device.

The color solid-state image pickup device of the invention is further characterized in that each of the photoelectric conversion areas is two-dimensionally partitioned into at least four segments; that is, a segment having red spectral sensitivity, a segment having green spectral sensitivity, a segment having blue spectral sensitivity, and a segment having spectral sensitivity whose peak appears in the vicinity of a wavelength of 520 nm.

By means of the configuration, image processing is performed through use of a signal read from the segment having the spectral sensitivity whose peak appears in the vicinity of a wavelength of 520 nm, thereby enabling acquisition of photograph image data having superior color reproducibility.

The color solid-state image pickup device of the invention is further characterized in that processing is performed by means of a signal read from the segment having spectral sensitivity whose peak appears in the vicinity of a wavelength of 520 nm, thereby performing color reproduction analogous to a color matching function.

By means of the configuration, an image closely resembling an image perceived by the human eye can be acquired.

The color solid-state image pickup device of the invention is further characterized in that arrangement of segments having the same spectral sensitivity differs from one photoelectric conversion area to an adjacent photoelectric conversion area.

By means of the configuration, occurrence of Moiré can be controllably suppressed further.

The color solid-state image pickup device of the invention is further characterized in that at least one of the segments in the photoelectric conversion areas differs in area from the other segments.

By means of the configuration, uniform spectral sensitivity or signal strength can be achieved in the respective segments, thereby enabling optimization of color balance.

The color solid-state image pickup device of the invention is further characterized in that areas of the segments in the photoelectric conversion areas are inversely proportional to the magnitude of relative spectral sensitivity per unit area of each segment.

By means of the configuration, sensitivity balance is optimized on a per-color basis, thereby enabling generation of superior image data.

A digital camera of the invention is characterized by comprising any one of the previously-described color solid-state image pickup devices.

By means of such a configuration, generation of a false signal and a false color is suppressed, thereby enabling photography of a high-sensitivity, high-resolution image having superior color reproducibility.

To achieve the object, the invention provides an MOS image sensor having a plurality of photoelectric conversion areas provided in an array on the surface of a semiconductor substrate, wherein the inside of each of the photoelectric conversion areas is two-dimensionally partitioned into a plurality of segments which output photoelectric conversion signals having different spectral sensitivities, and peripheral circuits connected to the segments are arranged around the photoelectric conversion areas.

By means of the foregoing configuration, segments having different spectral sensitivities are closely arranged on a two-dimensional surface. As a result, occurrence of a false signal and a false color is suppressed, and high-sensitivity, high-resolution image data having superior color reproducibility can be obtained. Moreover, the MOS image sensor can be manufactured inexpensively.

The MOS image sensor is further characterized in that the surface of the semiconductor substrate is covered with a light-shielding film having apertures assigned to the respective photoelectric conversion areas.

By means of the configuration, even when an attempt is made to miniaturize the segments, the apertures of the light-shielding film can be made larger than the wavelength of the incident light. Manufacture of the light-shielding film and the microlens is facilitated, thereby enabling photographing of an image having superior sensitivity.

The MOS image sensor is further characterized in that the diameter or diagonal dimension of the aperture is larger than the wavelength of incident light and smaller than the diameter or diagonal dimension of the photoelectric conversion area.

By means of the configuration, incident light easily reaches the photoelectric conversion section of each segment, thereby enabling production of an image signal having high sensitivity.

The MOS image sensor is further characterized in that one microlens is provided so as to correspond to one aperture.

By means of such a configuration, the utilization efficiency of incident light is improved, and manufacture of a microlens is facilitated.

The MOS image sensor is further characterized in that photoelectric conversion signals are sequentially read from respective segments into which the photoelectric conversion area is two-dimensionally partitioned.

By means of such a configuration, the number of read signal lines can be reduced.

The MOS image sensor is further characterized in that the photoelectric conversion signals read from the respective segments are output to a common signal line.

By means of such a configuration, the number of signal lines and the scale of peripheral circuits are further reduced, thereby increasing the proportion of a photoelectric conversion area occupying the chip area of a semiconductor.

The MOS image sensor is further characterized in that the spectral sensitivity of at least one segment is determined by a color filter provided above said segment.

By means of such a configuration, setting of spectral sensitivity is facilitated, thereby enabling provision of a desired spectral characteristic.

The MOS image sensor is further characterized in that the spectral sensitivity of at least one segment of the photoelectric conversion areas is determined by the distribution of impurities in a depthwise direction of the segment.

By means of such a configuration, a color MOS image sensor can be formed without use of a color filter.

The MOS image sensor is further characterized in that the spectral sensitivity of at least one segment is determined by a color filter disposed above the segment and the distribution of impurities in a depthwise direction of the segment.

By means of such a configuration, there is utilized the spectral characteristic determined by combination of the spectral characteristic of the color filter and the spectral characteristic determined by the distribution of impurities. The spectral characteristic of the segment using a color filter is improved, thereby improving the color reproducibility of a color image photographed by the MOS image sensor.

The MOS image sensor is further characterized in that the segment has a p-well layer provided on an n-type semiconductor substrate, and an n-type impurity layer formed on the p-well layer, and the spectral sensitivity of the segment is determined by selecting the depth of the p-well layer and the depth of the n-type impurity layer.

By means of such a configuration, segments having different spectral sensitivities can be formed without use of a color filter, thereby facilitating manufacturing processes and improving manufacturing yield.

The MOS image sensor is further characterized in that the depth of an n-type impurity layer of the segment having blue spectral sensitivity, the depth of an n-type impurity layer of the segment having green spectral sensitivity, and the depth of an n-type impurity layer of the segment having red spectral sensitivity are made progressively deeper, in this sequence.

By means of such a configuration, the light entering the semiconductor substrate of the MOS image sensor can be distinguished and detected by a wavelength; i.e., the depth to which the light has entered the semiconductor substrate.

The MOS image sensor is further characterized in that depth of a p-well layer of the segment having blue spectral sensitivity, the depth of a p-well layer of the segment having green spectral sensitivity, and the depth of a p-well layer of the segment having red spectral sensitivity are made progressively deeper, in this sequence.

By means of such a configuration, the optical electric charges produced by the light in a long-wave range of each spectral sensitivity flow into the substrate, whereby the long-wave range of each spectral characteristic is attenuated.

The MOS image sensor is further characterized in that the individual photoelectric conversion area is two-dimensionally partitioned into at least three segments; i.e., a segment having red spectral sensitivity, a segment having green spectral sensitivity, and a segment having blue spectral sensitivity.

By means of such a configuration, photograph image data formed from primary-color-based color signals can be read from the MOS image sensor.

The MOS image sensor is further characterized in that the individual photoelectric conversion area is two-dimensionally partitioned into at least four segments; i.e., a segment having yellow spectral sensitivity, a segment having cyan spectral sensitivity, a segment having magenta spectral sensitivity, and a segment having green spectral sensitivity.

By means of such a configuration, photograph image data formed from complementary-color-based color signals can be read from the MOS image sensor.

The MOS image sensor is further characterized in that the individual photoelectric conversion area is two-dimensionally partitioned into at least four segments; i.e., a segment having red spectral sensitivity, a segment having green spectral sensitivity, a segment having blue spectral sensitivity, and a segment having spectral sensitivity whose peak appears in the vicinity of a wavelength of 520 nm.

By means of the configuration, image processing is performed through use of a signal read from the segment having the spectral sensitivity whose peak appears in the vicinity of a wavelength of 520 nm, thereby enabling acquisition of photograph image data having superior color reproducibility.

The MOS image sensor is further characterized in that processing is performed by use of a signal read from the segment having spectral sensitivity whose peak appears in the vicinity of a wavelength of 520 nm, to thus perform color representation analogous to a color matching function.

By means of the configuration, a color image closely resembling a color image perceived by the human eye can be acquired.

The MOS image sensor is characterized by further comprising segments which have equivalent spectral sensitivity and are arranged in a different pattern, at a position between the adjacent photoelectric conversion areas.

By means of the configuration, occurrence of Moiré can be controllably suppressed further.

The MOS image sensor is further characterized in that the area of at least one segment of the segments within the photoelectric conversion areas differs from that of another segment.

By means of the configuration, uniform spectral sensitivity or signal strength can be achieved in the respective segments, thereby enabling optimization of color balance.

The MOS image sensor is further characterized in that the area of each segment in the photoelectric conversion areas is inversely proportional to the magnitude of relative spectral sensitivity per unit area of the segment.

By means of the configuration, sensitivity balance is optimized on a per-color basis, thereby enabling generation of superior image data.

The MOS image sensor is further characterized in that the image sensor is of passive or active type. The MOS image sensor of the invention can be applied to an image sensor regardless of whether the sensor is of passive or active type, such as CMOS.

To achieve the object, the invention provides a digital camera characterized by comprising anyone of the MOS image sensors described above.

By means of such a configuration, generation of a false signal and a false color is suppressed, thereby enabling photography of a high-sensitivity, high-resolution image having superior color reproducibility.

DESCRIPTION OF THE PREFERRED EMBODIMENTS

Embodiments of the invention will be described hereunder by reference to the drawings.

First Embodiment

Figure 1:
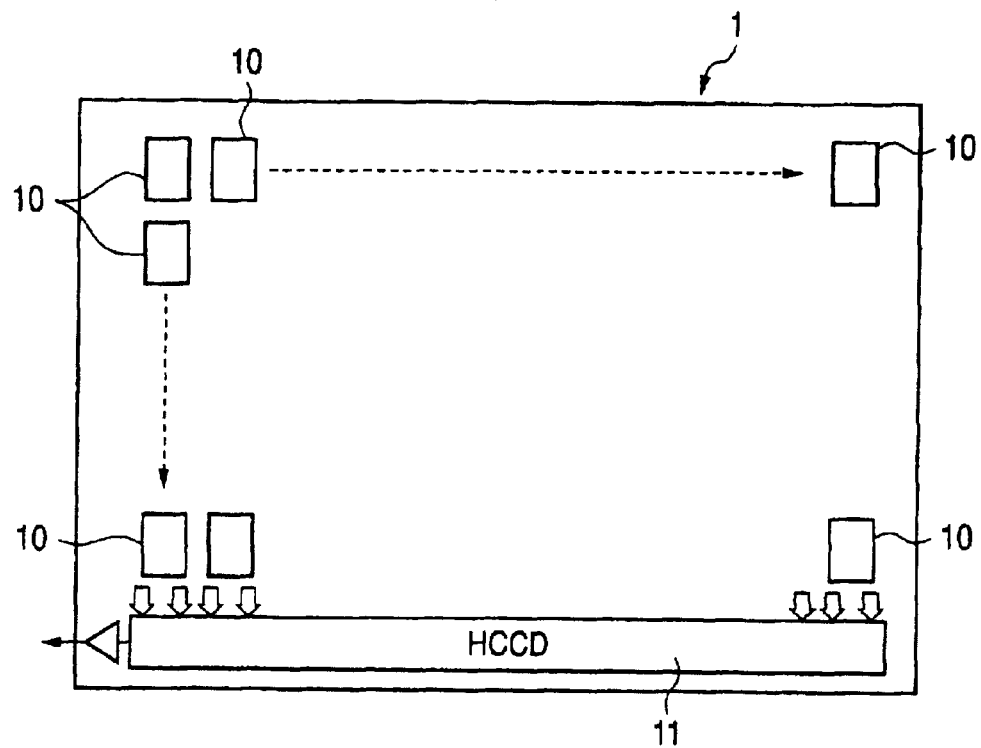
FIG. 1 is a block diagram of a color solid-state image pickup device according to a first embodiment of the invention.

FIG. 1 is a block diagram of a color solid-state image pickup device of single chip type according to a first embodiment of the invention. In this embodiment, photoelectric conversion regions 10 to be described in detail later (individual photoelectric conversion regions will hereinafter be called pixel sections) are provided and formed, in a square grid pattern, on the surface of the semiconductor substrate constituting the solid-state image pickup device 1 of single chip type of the embodiment.

The inside of each pixel section 10 is two-dimensionally partitioned into a plurality of segments having a plurality of different spectral sensitivities (the segments will also be called "small pixels"). Electric charges stored in the respective small pixels are sequentially read into a vertical transfer channel, the channel being formed so as to vertically pass through the pixels sections 10 adjoining each other in the horizontal direction shown in FIG. 1. The electric charges transferred over the vertical transfer channel are then transferred to the horizontal transfer channel (HCCD) 11 and output from the color solid-state image pickup device 1.

Figure 2:
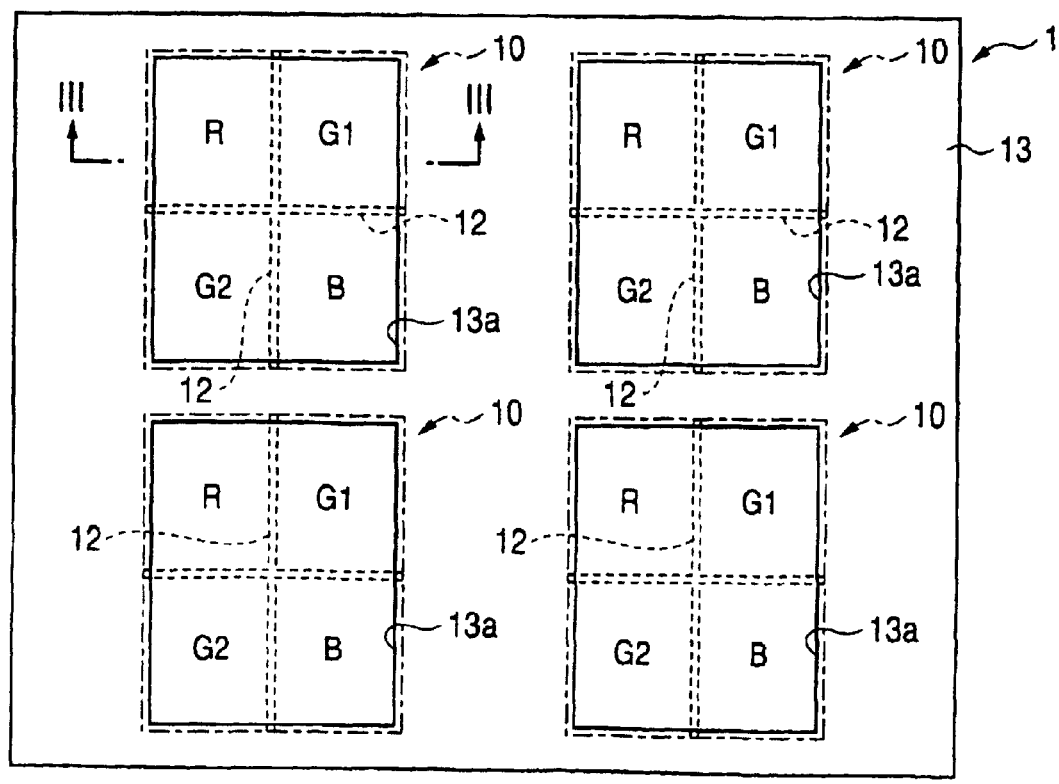
FIG. 2 is an enlarged plan view of the principal section of the color solid-state image pickup device shown in FIG. 1.

FIG. 2 is an enlarged plan view of four pixel sections 10 of the color solid-state image pickup device of single chip type shown in FIG. 1. Each pixel section 10 is divided into a total of four small pixels lengthwise and crosswise by means of element isolation zones 12; namely, a small pixel having red spectral sensitivity (denoted by R in the drawing); a small pixel having blue spectral sensitivity (denoted by B); and two small pixels having two different kinds of green spectral sensitivities (denoted by G1 and G2 in the drawing).

The color solid-state image pickup 1 of single chip type shown in FIG. 2 shows a state in which the device 1 is covered with a light-shielding film 13. Apertures 13a are formed in the light-shielding film 13 so as to be assigned to the respective pixel sections 10. Individual apertures are not provided for the respective small pixels R, G1, G2, and B in each pixel section 10. Therefore, even when an attempt is made to miniaturize the pixel section 10 or the small pixels R, G1, G2, and B (i.e., increase the number of pixels), the size of the aperture 13a can be ensured to be larger than the wavelength of light. Thus, an image having superior sensitivity can be photographed.

Figure 3:
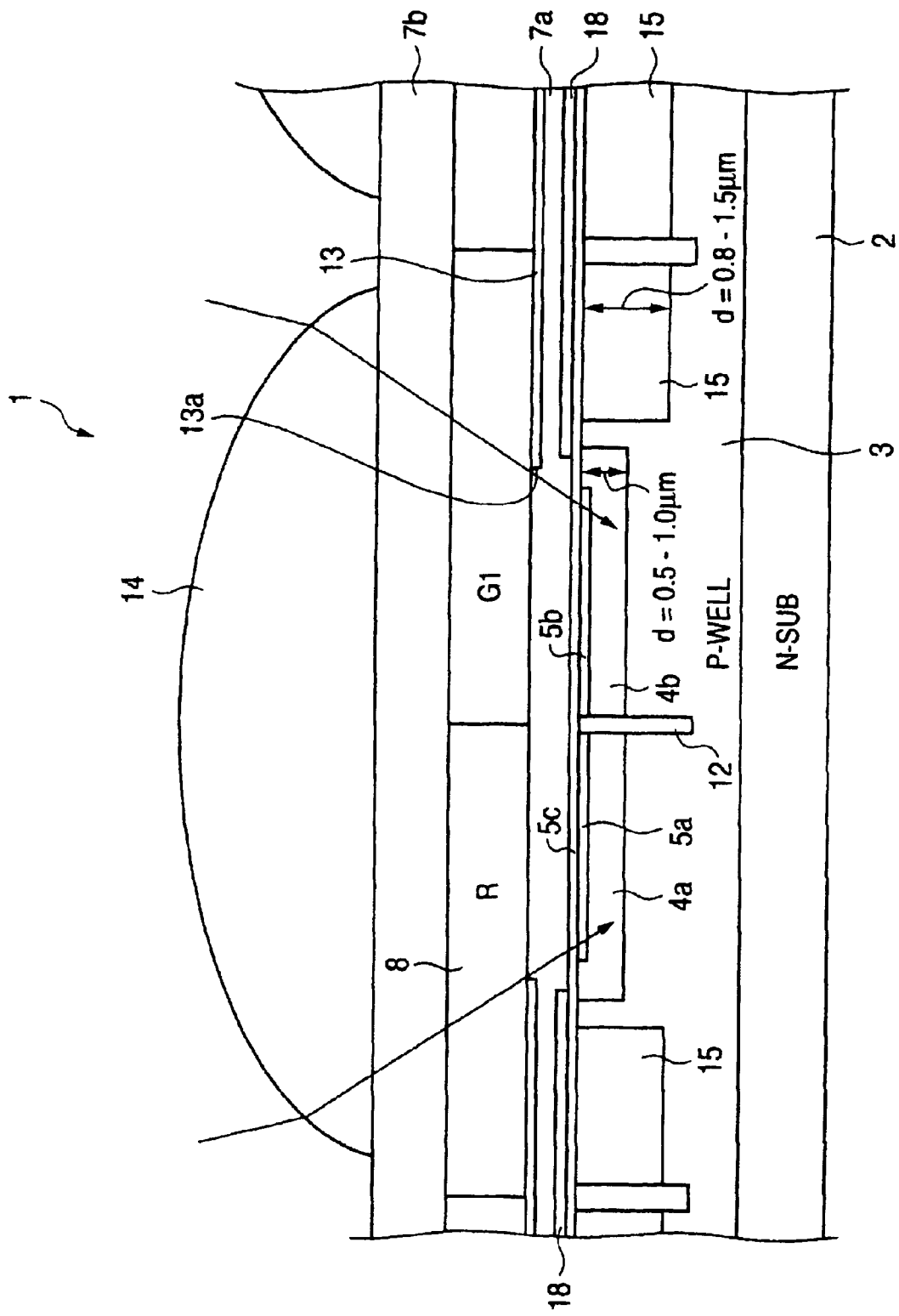
FIG. 3 is a cross-sectional view of a pixel section shown in FIG. 1.

FIG. 3 is a cross-sectional view of one pixel 10 of the color solid-state image pickup device 1 of single chip type, where a microlens is provided on the pixel 10, and corresponds to a cross-sectional view taken along line III-III shown in FIG. 2. A p-well layer 3 is formed on the surface of an n-type substrate 2. N-type impurity layers 4a, 4b isolated by means of only the element isolation zones 12 are formed on the surface of the p-well layer 3. A p-n junction formed between the p-well layer 3 and the n-type impurity layers 4a, 4b constitutes a photodiode (a photoelectric conversion section), and photoelectric charges corresponding to the incident light are stored in the n-type impurity layers 4a, 4b.

Heavily-doped p-type impurity layers (surface $p^+$-layers) 5a, 5b are formed on the surfaces of the respective n-type impurity layers 4a, 4b. The surface of the semiconductor is covered with an oxide film 5c. N-type impurity layers 15 formed beside the n-type impurity layers 4a, 4b constitute vertical transfer channels. Transfer electrodes 18 are provided on the respective vertical transfer channels 15 via the oxide film 5c.

A planarization film 7a is further provided on the transfer electrode 18. The light-shielding film 13 that has the apertures 13a and covers the transfer electrode and the vertical transfer channels is provided on the planarization film 7a. Further, a color filter layer 8 is formed on the light-shielding film 13. One microlens 14 is provided for one aperture of the light-shielding film 13 by way of the planarization film 7b.

The small pixels R, G1, G2, and B shown in FIG. 2 and subsequent drawings do not designate a color portion of the color filter layer 8 but designate the n-type impurity layers 4a, 4b that are present below the color filter layer 8 and shown in FIG. 3. The reference symbols "R," "G1," "G2," and "B" denote spectral sensitivities produced by colors of the color filter layer 8 of the photodiode fabricated from the n-type impurity layers 4a, 4b and the p-well layer 3.

One microlens (top lens) 14 of the embodiment is provided for one pixel section 10. The microlens 14 is designed such that all the light rays having entered the pixel section by way of the microlens 14 fall within a corresponding aperture 13a of the light-shielding film 13.

In the embodiment, the incident light gathered by the top lens 14 does not need to be converged accurately on any of the small pixels so as to form an image. The only requirement is to gather a luminous flux into the aperture 13a, thereby facilitating manufacture of the microlens 14.

Figure 4:
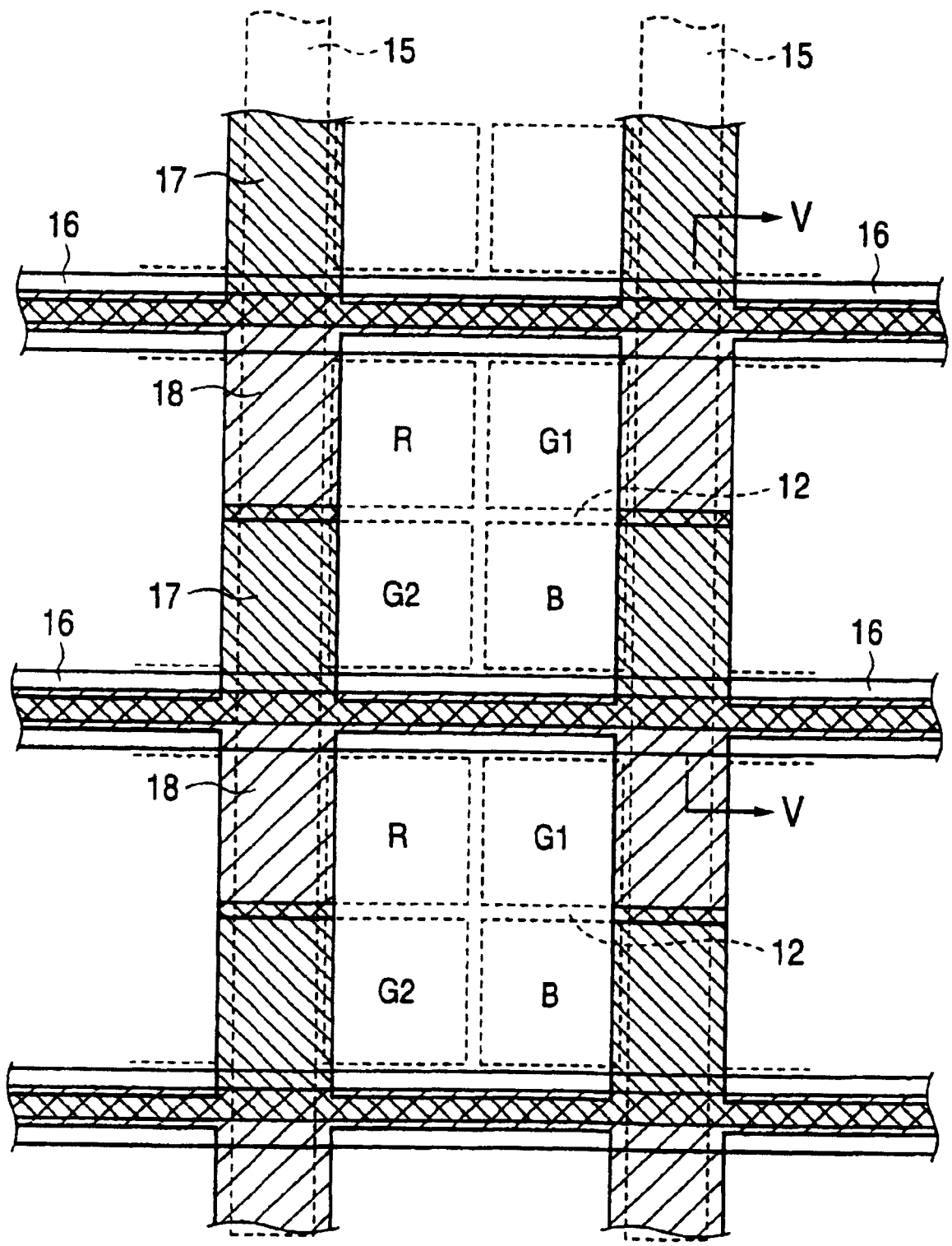
FIG. 4 is a schematic plan view of four pixel sections from which a light-shielding film shown in FIG. 2 is removed.
Figure 5:
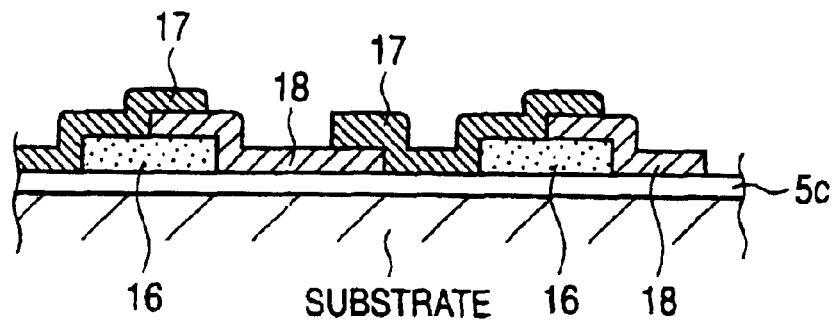
FIG. 5 is a cross-sectional view taken along line V-V shown in FIG. 4.

FIG. 4 is a plan view showing two pixel sections of the pixel sections shown in FIG. 2 while the light-shielding film 13 is removed from the pixel sections. The vertical transfer channels 15 are formed on both sides of the respective pixel sections 10. In the embodiment, as shown in FIG. 5 (a cross-sectional view taken along line V-V shown in FIG. 4), transfer electrodes 16, 17, and 18 of three-layer structure made of polysilicon are stacked on a buried channel (vertical transfer channel) 15 by way of the oxide film 5c. The electrodes are activated by means of, e.g., a three-phase transfer pulse. The vertical transfer channel 15 and the electrodes 16, 17, and 18 are formed so as to avoid the element isolation zone 12 existing between the small pixels R, G1, G2, and B adjoining each other within the pixel section 10 and to exist between the pixel sections 10.

Specifically, when the surface of the semiconductor of the solid-state image pickup device is covered with the light-shielding film 13, the electrodes 16, 17, and 18 as well as the vertical transfer channel 15 are concealed with the light-shielding film 13. As shown in FIG. 2, the vertical transfer channel 15 and the electrodes 16, 17, and 18 are configured so as not to be exposed within the aperture 13a. As a result, the distance between small pixels adjoining each other within one pixel section 10 can be set to a minimum processing dimension required for element isolation. Shortening of the distance between small pixels and inhibition of occurrence of a false color can be achieved even when manufacturing processes, a design rule, and a chip size are identical with those employed in the related art.

A plurality of small pixels having different spectral sensitivities are arranged as a pixel section in a concentrated manner. The small pixels are formed so as to adjoin each other with solely the element isolation zone 12 being interposed therebetween. Hence, the proportion of an area occupied by the region to be used for effecting photoelectric conversion on a chip becomes larger than that of the related-art solid-state image pickup device, thereby enhancing the utilization factor of a chip.

In the color solid-state image pickup device 1 of single chip type having such a configuration, electric charges stored in the small pixel R and those stored in the small pixel G1 are read into the vertical transfer channel 15. The electric charges are transferred to the horizontal transfer channel 11 (FIG. 1) along the vertical transfer channel 15. Next, the electric charges are transferred along the horizontal transfer channel 11 and output from the solid-state image pickup device 1. Next, the electric charges stored in the small pixel G2 and those stored in the small pixel B are read into the vertical transfer channel 15. The electric charges are transferred to the horizontal transfer channel 11 along the vertical transfer channel 15. The electric charges are then transferred along the horizontal transfer channel 11 and output from the solid-state image pickup device 1.

As mentioned above, according to the embodiment, a plurality of small pixels are arranged at one area in a concentrated manner, to thus constitute one pixel section. The distance between the small pixels within one pixel section is made shorter than that between the small pixels within adjacent pixel sections. Hence, even when an attempt is made to increase resolution by means of miniaturizing the small pixels, the apertures 13a of the light-shielding film 13 can be made large, to thereby enable photographing of a high-sensitivity image. Even when a diameter "t" (diameter or a diagonal line length) of each aperture 13a is made fine up to, e.g., $t=\lambda \sim 2\lambda$ with reference to the wavelength $\lambda$ (mm) of a red color, output signals of three to four colors corresponding to respective color components are not attenuated.

In the embodiment, two small pixels G1, G2 having different spectral are provided as small green pixels. Therefore, faithful color reproduction can be effected as compared with a case where only a single green small pixel G is provided. Further, the arrangement cycle of the small pixels having identical spectral sensitivities can be made small by increasing resolution. Hence, occurrence of Moiré is also suppressed, to thereby enable improved color reproduction and acquisition of a high-quality image.

Second Embodiment

Figure 6:
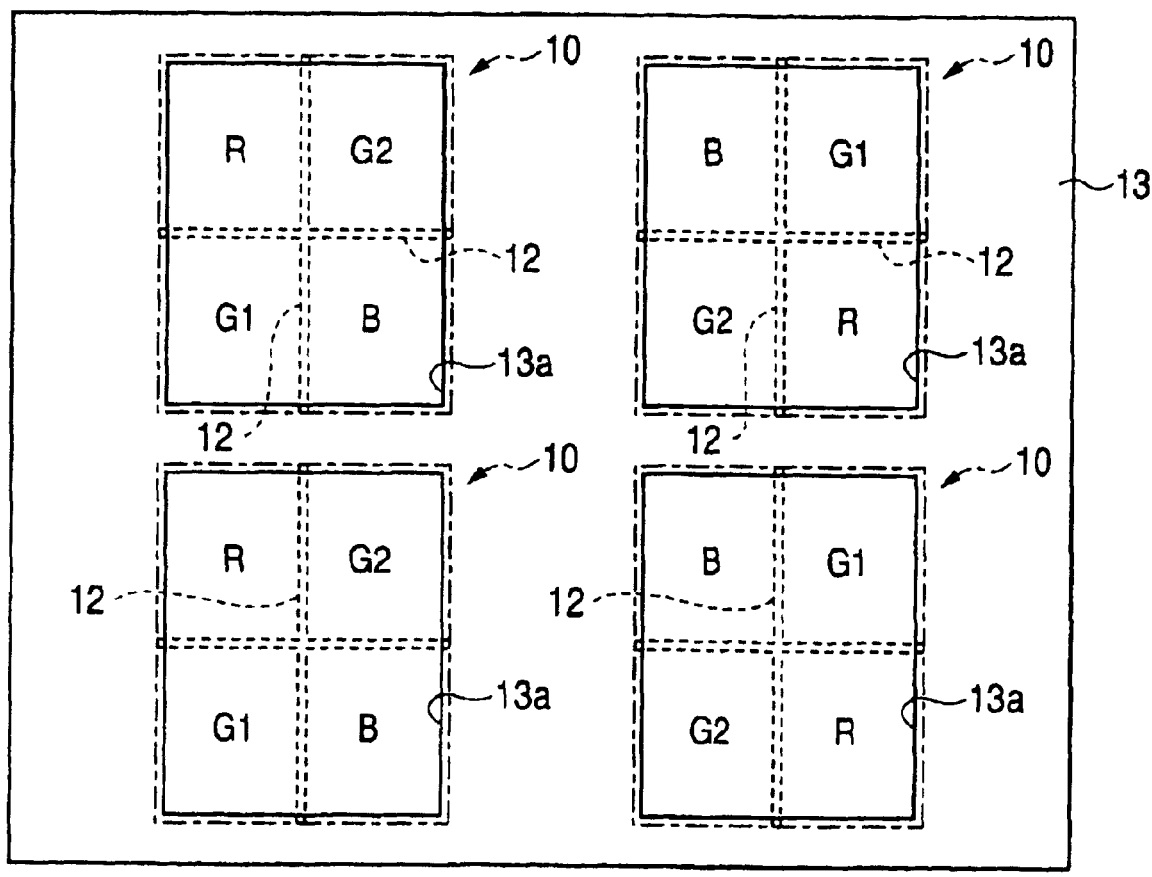
FIG. 6 is a plan view of the principal section of a color solid-state image pickup device according to a second embodiment of the invention.

FIG. 6 is an enlarged plan view of the principal section of a color solid-state image pickup device according to a second embodiment of the invention, showing four pixel sections provided with the light-shielding film. In the first embodiment, the small pixels; that is, the small pixels R, G1, G2, and B, are arranged in the same pattern within all the pixel sections 10. However, in this embodiment, the arrangement of the small pixels R, G1, G2, and B is regularly changed from one pixel section to another pixel section. This is intended for diminishing a cyclic false signal stemming from the arrangement of a color filter.

When the arrangement of small pixels having different spectral sensitivities is to be changed within the pixel section, (1) a conceivable measure is to alternately switch vertical and horizontal color layouts on a per-column or per-row basis in the pixel section; and (2) another conceivable measure is to change the arrangement of a color filter (B) corresponding to a short wavelength and that of a color filter (R) corresponding to a long wavelength at the light-receiving center and periphery of the solid-state image pickup device, thereby improving shading of light, which would otherwise arise in the light-receiving section or the periphery of a light-shielding aperture.

In this way, an image whose quality is much better than that obtained in the first embodiment can be produced by cyclically changing the arrangement of small pixels within the pixel section.

Third Embodiment

Figure 7:
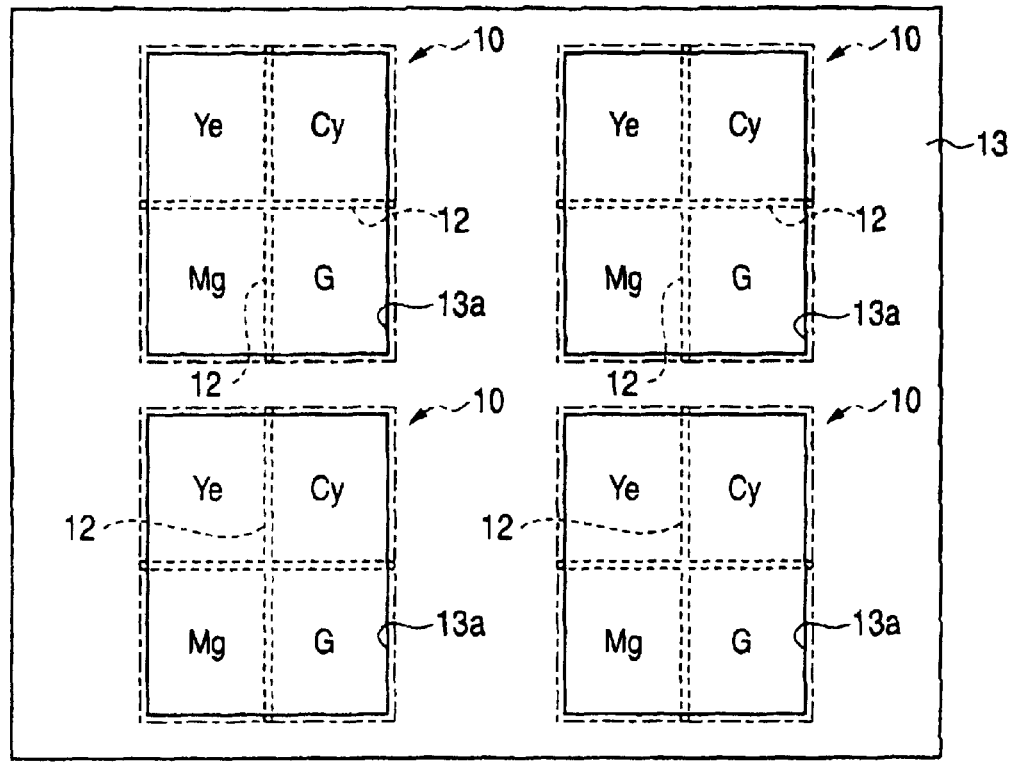
FIG. 7 is a plan view of the principal section of a color solid-state image pickup device according to a third embodiment of the invention.

FIG. 7 is an enlarged plan view of the principal section of a color solid-state image pickup device according to a third embodiment of the invention, showing four pixel sections provided with the light-shielding film. The first embodiment has used primary-color-based color filters, and two kinds of filters G1, G2 as green color filters. In contrast, the present embodiment employs complementary-color-based four color filters yellow (Ye), magenta (Mg), cyan (Cy), and green (G).

The complementary-color-based color filters are formed from four colors. When a pixel section is formed from four small pixels as in the case of the present embodiment, four colors are convenient for allocating the colors to the respective small pixels. Even in this embodiment, as in the case of the second embodiment, a cyclic change in the arrangement of the small pixels Ye, Cy, Mg, and G within each pixel section is preferable.

Fourth Embodiment

Figure 8:
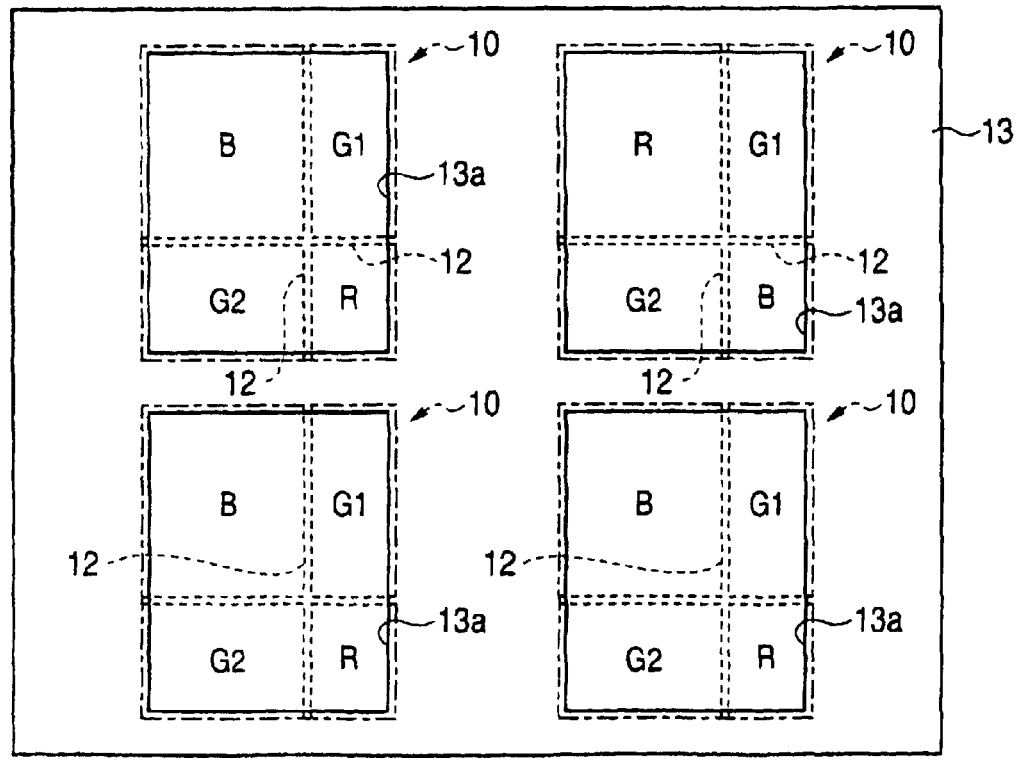
FIG. 8 is a plan view of the principal section of a color solid-state image pickup device according to a fourth embodiment of the invention.

FIG. 8 is an enlarged plan view of the principal section of a color solid-state image pickup device according to a fourth embodiment of the invention, showing four pixel sections provided with the light-shielding film. In the previous embodiments, the pixel section 10 is divided into four small pixels of equal areas. However, in this embodiment, the pixel section 10 is partitioned into four small pixels of different areas. Different spectral sensitivities R, G1, G2, and B are assigned to the respective small pixels. Adjustment of color balance and optimization of light sensitivity are facilitated by means of changing the areas of small pixels.

The areas of the respective small pixels within the pixel section 10 are preferably set so as to be inversely proportional to the magnitude of relative spectral sensitivity per unit area of each small pixel. Specifically, the area of a small pixel for a color having high sensitivity is made small, and the area of a small pixel for a color having low sensitivity is made large.

Fifth Embodiment

Figure 9:
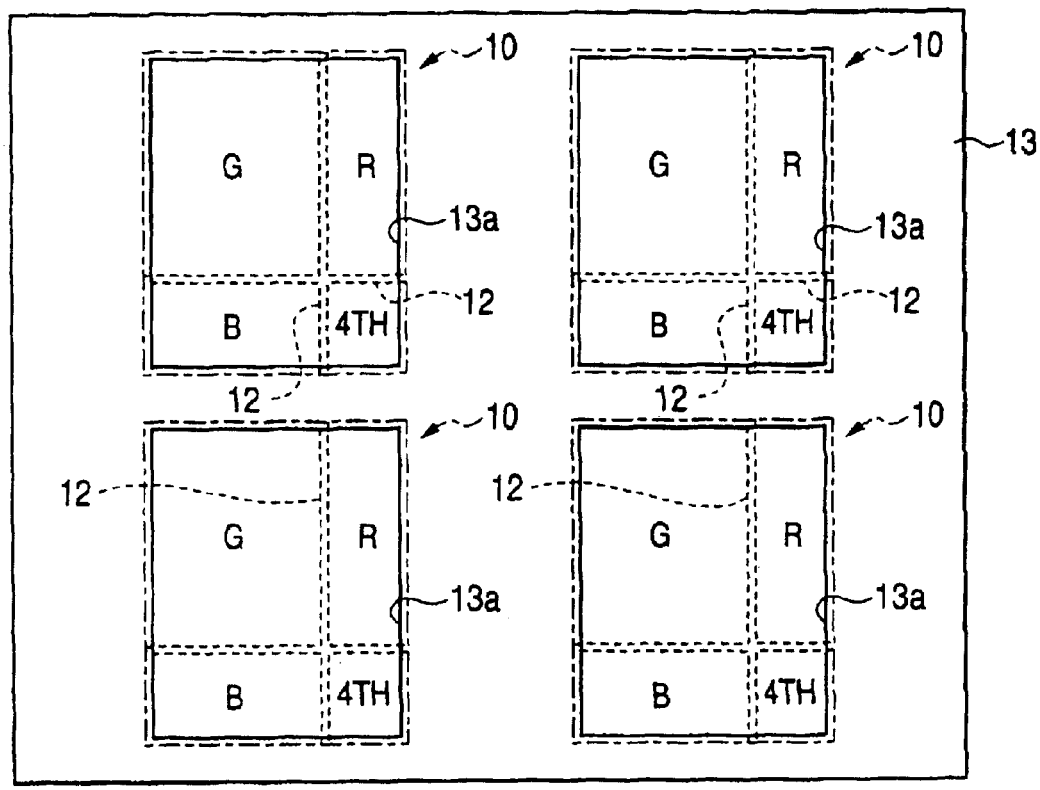
FIG. 9 is a plan view of the principal section of a color solid-state image pickup device according to a fifth embodiment of the invention.

FIG. 9 is an enlarged plan view of the principal section of a color solid-state image pickup device according to a fifth embodiment of the invention, showing four pixel sections provided with the light-shielding film. In this embodiment, in addition to the small pixels having the primary-color-based spectral sensitivities R, G, and B, a small pixel of the smallest area is provided with a fourth spectral sensitivity differing from the spectral sensitivities R, G, and B.

Figure 10:
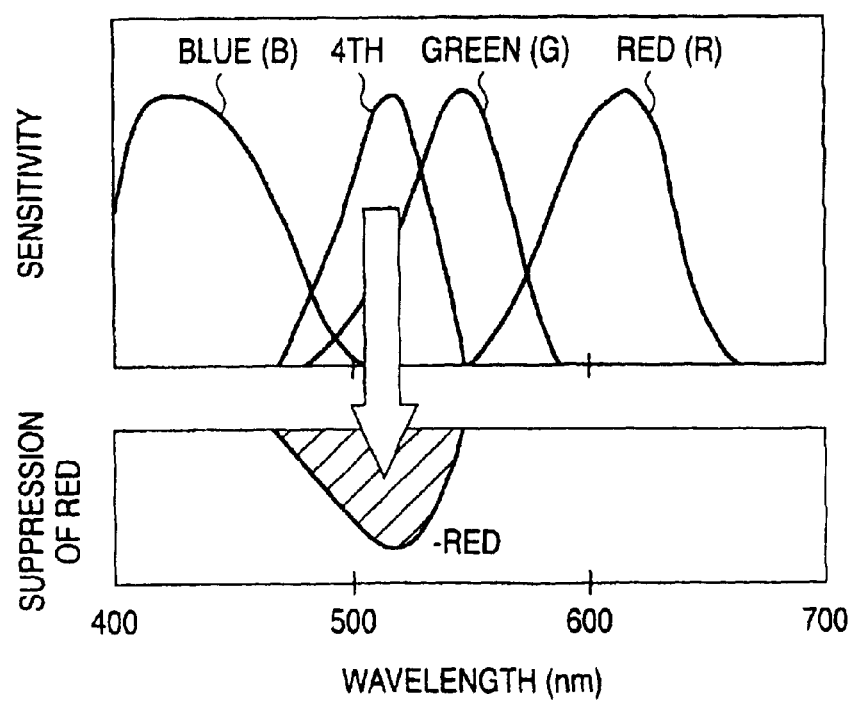
FIG. 10 is a descriptive view of a fourth spectral sensitivity used in the fifth embodiment of the invention.
Figure 11:
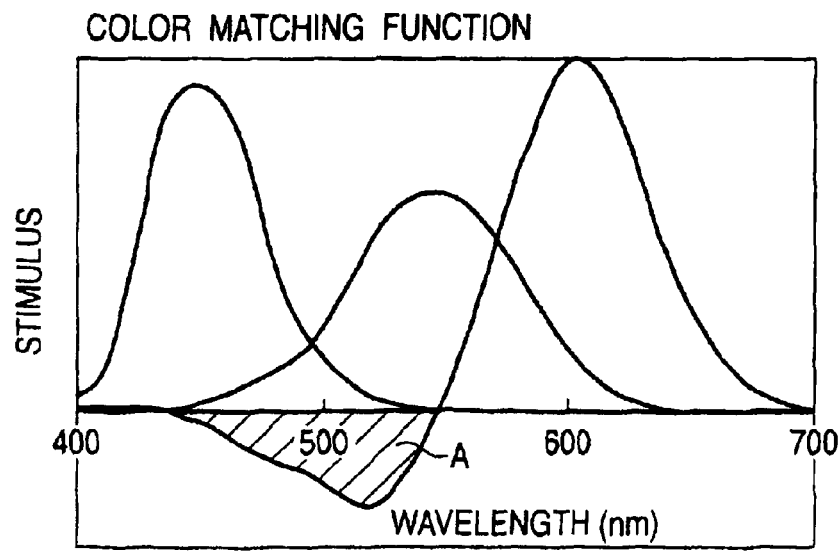
FIG. 11 is a graph showing R, G, and B color matching functions.

As shown in FIG. 10, the fourth spectral sensitivity of the embodiment is, for example, a spectral sensitivity having a peak around a wavelength of 520 nm. FIG. 11 is a graph showing a color matching function. A negative area A is located in the vicinity of 520 nm in connection with a red (R) color. Faithful color reproduction cannot be achieved without materializing the spectral sensitivity of the negative area A. For this reason, according to the embodiment, the amount of signal electric charges corresponding to the quantity of light at a wavelength of about 520 nm is detected by means of a small pixel having the fourth spectral sensitivity. The thus-detected amount of signal electric charges is subtracted from the amount of signal electric charges corresponding to the quantity of red R light, to thereby materialize the spectral sensitivity of the negative area A of the color matching function and enable color representation as perceived by the human eyes.

Sixth Embodiment

Figure 12:
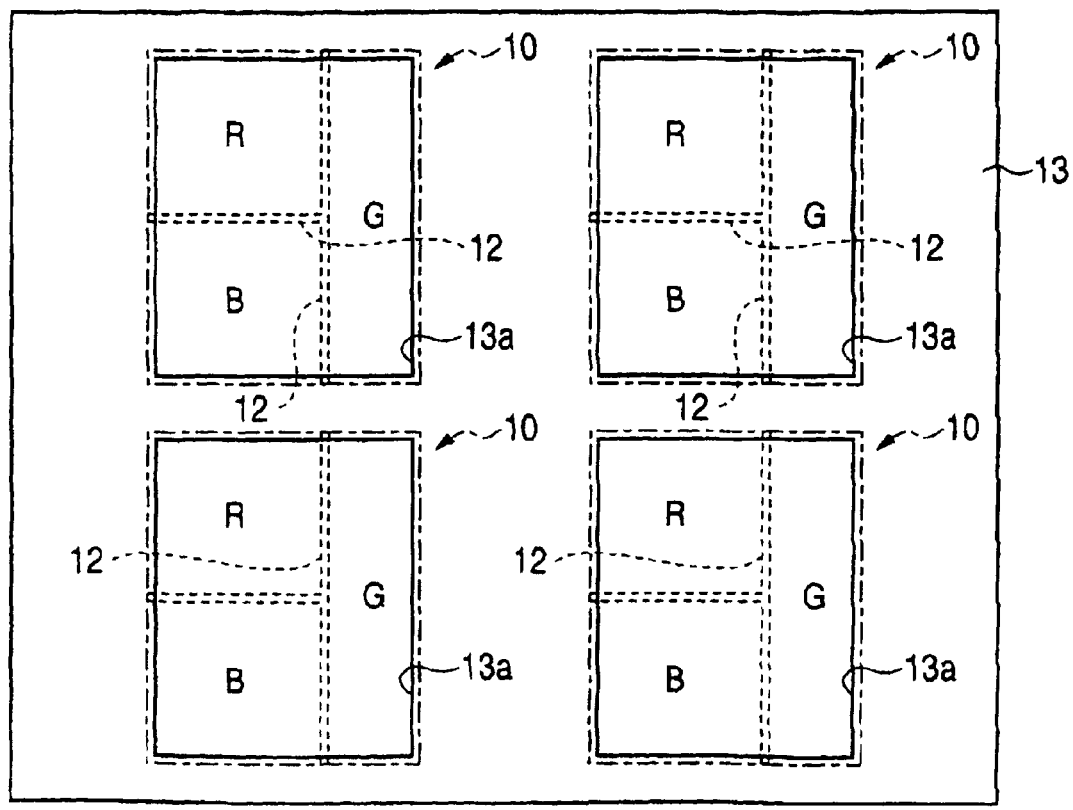
FIG. 12 is a plan view of the principal section of a color solid-state image pickup device according to a sixth embodiment of the invention.

FIG. 12 is an enlarged plan view of the principal section of a color solid-state image pickup device according to a sixth embodiment of the invention, showing four pixel sections provided with the light-shielding film. In the previously-described embodiments, four small pixels are arranged adjacently, to thereby constitute one pixel section. This embodiment differs from those embodiments in that one pixel section is formed from three small pixels R, G, and B.

Seventh Embodiment

Figure 13:
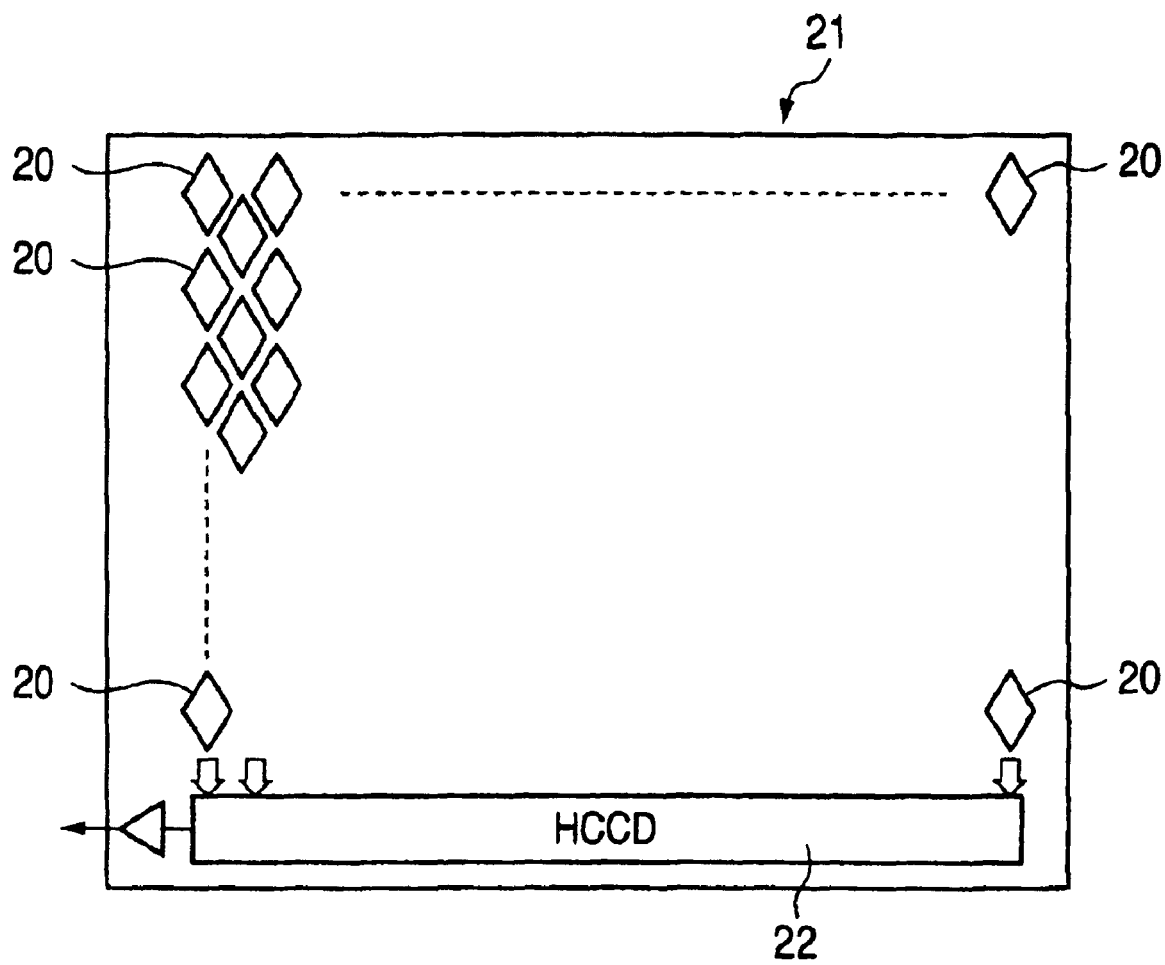
FIG. 13 is a block diagram of a color solid-state image pickup device according to a seventh embodiment of the invention.

FIG. 13 is a block diagram of a color solid-state image pickup device according to a seventh embodiment of the invention. In the previously-described embodiments, the pixel sections 10 are arranged in a square grid pattern. The present embodiment differs from those embodiments in that pixel sections 20 are arranged in a so-called honeycomb pattern by offsetting odd lines from even lines by half a pitch.

The pixel sections 20 are arranged in a honeycomb pattern, and hence vertical transfer channels (omitted from FIG. 13) to be provided on both sides of the pixel section 20 are eventually arranged in a winding pattern. The signal electric charges (electric charges stored in the respective small pixels constituting the pixel section 20) that have been transferred to the horizontal transfer channel 22 by way of the vertical transfer channel are transferred through the horizontal transfer channel 22 and output from the solid-state image pickup 21.

Figure 14:
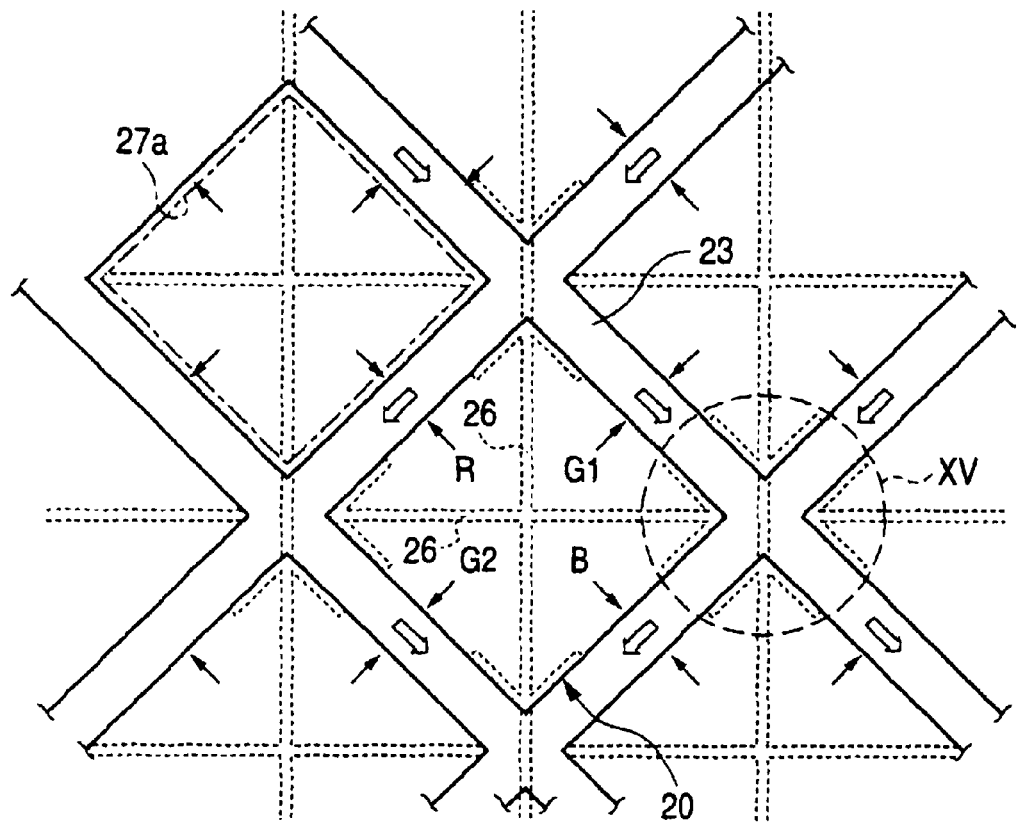
FIG. 14A is an enlarged plan view of the principal section of the color solid-state image pickup device shown in FIG. 13.
FIG. 14B is a plan view of a light-shielding film for four pixel sections.
Figure 14:
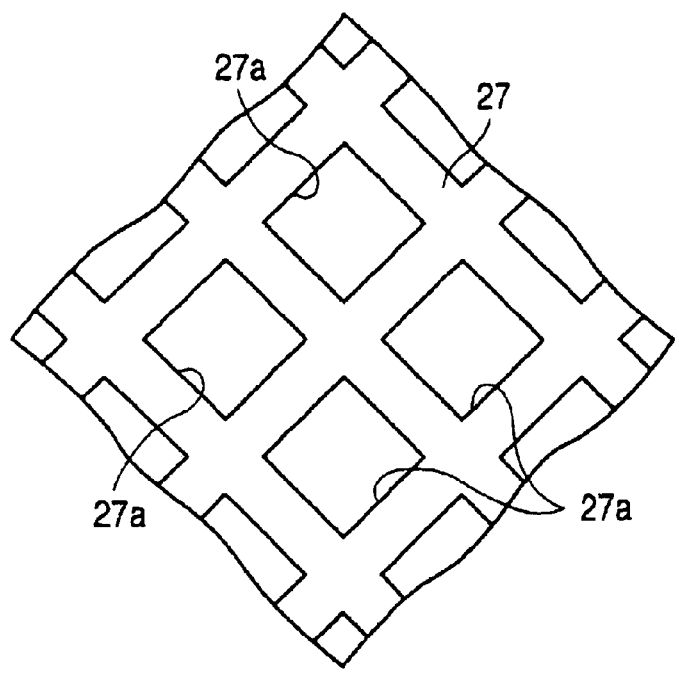
Figure 15:
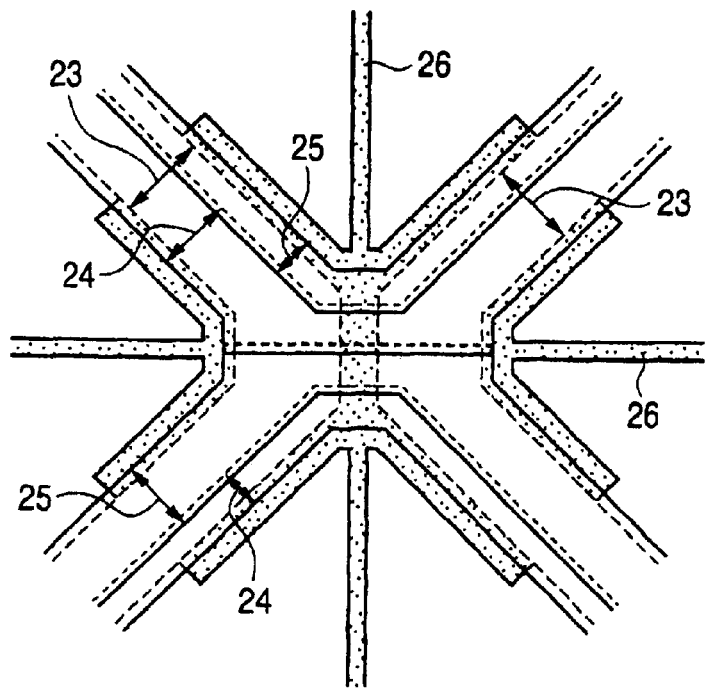
FIG. 15 is an enlarged view of an area encircled by a circular broken line XV shown in FIG. 14A.

FIG. 14A shows an enlarged plan view of the pixel section 20 from which the light-shielding film is removed. FIG. 14B is a plan view of a light-shielding film for four pixel sections. FIG. 15 is an enlarged view of an area encircled by broken circle lines XV shown in FIG. 14A.

The vertical transfer channels 23 arranged in a winding pattern are formed on both sides of the pixel section 20. Transfer pulse electrodes 24, 25 made of polysilicon are provided so as to overlap the vertical transfer channels 23. The small pixels R, G1, G2, and B that constitute the pixel section 20 and are arranged adjacent to each other are isolated from each other by means of an element isolation zone 26. As in the case of the first embodiment, within the pixel section 20 the small pixels R, G1, G2, and B are two-dimensionally partitioned to minimum processing dimensions required for element isolation.

In the illustrated embodiment, the rectangular pixel section 20 inclined at a degree of 45° is configured to be two-dimensionally partitioned into four small pixels R, G1, G2, and B by means of two diagonal lines, wherein the stored electric charges are read into the vertical transfer channels 23 which the small pixels face. A light-shield film 27 is provided over the pixel section 20, wherein apertures are formed so as to correspond to respective pixels sections 20 (only an aperture 27a assigned to one pixel section 20 shown in FIG. 14A is illustrated by a phantom line, to thereby prevent complication of drawings). As mentioned above, the transfer pulse electrodes 24, 25 are provided so as to overlap the vertical transfer channels 23. The electrodes 24, 25 and the vertical transfer channel 23 are not exposed within the aperture 27a of the light-shield film 27. As a result, only the small pixels R, G1, G2, and B that are isolated by the element isolation zones 26 manufactured with the minimum processing dimension are exposed.

Even in the embodiment, the distance between the small pixels within one pixel section 20 is made shorter than that existing between small pixels provided within an adjacent pixel section, and hence there is yielded an advantage identical with that yielded in the first embodiment. The pixel sections 20 are arranged in a honeycomb pattern. When compared with a case where the pixel sections are arranged in a square grid pattern, wiring areas required by vertical CCD transfer electrodes (i.e., the wiring areas are neither light-receiving sections nor electric charge transfer sections and are invalid areas) are eliminated, thereby effectively utilizing a surface area of the image pickup element. Further, an attempt can be made to enhance sensitivity and resolution.

Although the invention has been described in connection with the small pixels R, G1, G2, and B, the complementary-color-based small pixels G, Cy, Ye, and Mg may be employed instead. Alternatively, the invention can employ primary-color R, G, B small pixels and the small pixel which has been described by reference to FIG. 9 and has the fourth spectral sensitivity.

Even in the embodiment of the honeycomb pattern, the layout of small pixels within the pixel section is changed cyclically as in the second embodiment, thereby making an attempt to enhance color reproducibility and the quality of an image.

Eighth Embodiment

Figure 16:
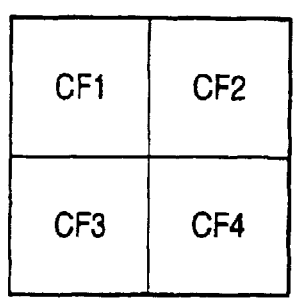
FIG. 16 is a view showing an example of two-dimensional partition of a pixel section of the solid-state color image pickup device according to an eighth embodiment of the invention.
Figure 16:
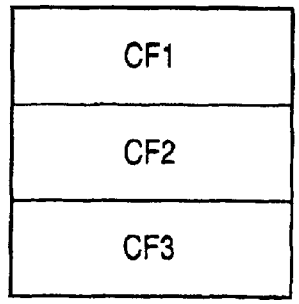
Figure 16:
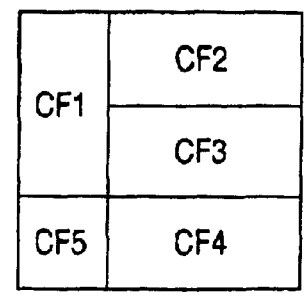
Figure 16:
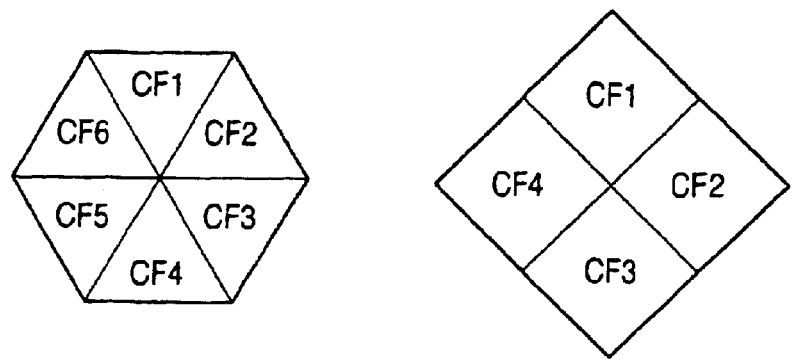

Even when the pixel sections are arranged in a square grid pattern or a honeycomb pattern, the manner of two-dimensionally partitioning the inside of each pixel section is arbitrary. The geometry of the pixel section is also arbitrary. FIG. 16 shows various shapes for the pixel section and a method for two-dimensionally partitioning a pixel section into small pixels. In the drawing, a first spectral sensitivity is denoted by CF1; a second spectral sensitivity is denoted by CF2; . . . and a sixth spectral sensitivity is denoted by CF6.

In the case of a primary-color-based color filter, the number of small pixels constituting one pixel section is at least three for three colors R, G, and B. An increase in the number of small pixels, such as to four, five, or six, enables provision of various pixels such as a small pixel having a fourth spectral sensitivity or small pixels having other kinds of spectral sensitivities. Detection signals of these small pixels enable various forms of image processing which enhance picture quality.

Ninth Embodiment

Figure 17:
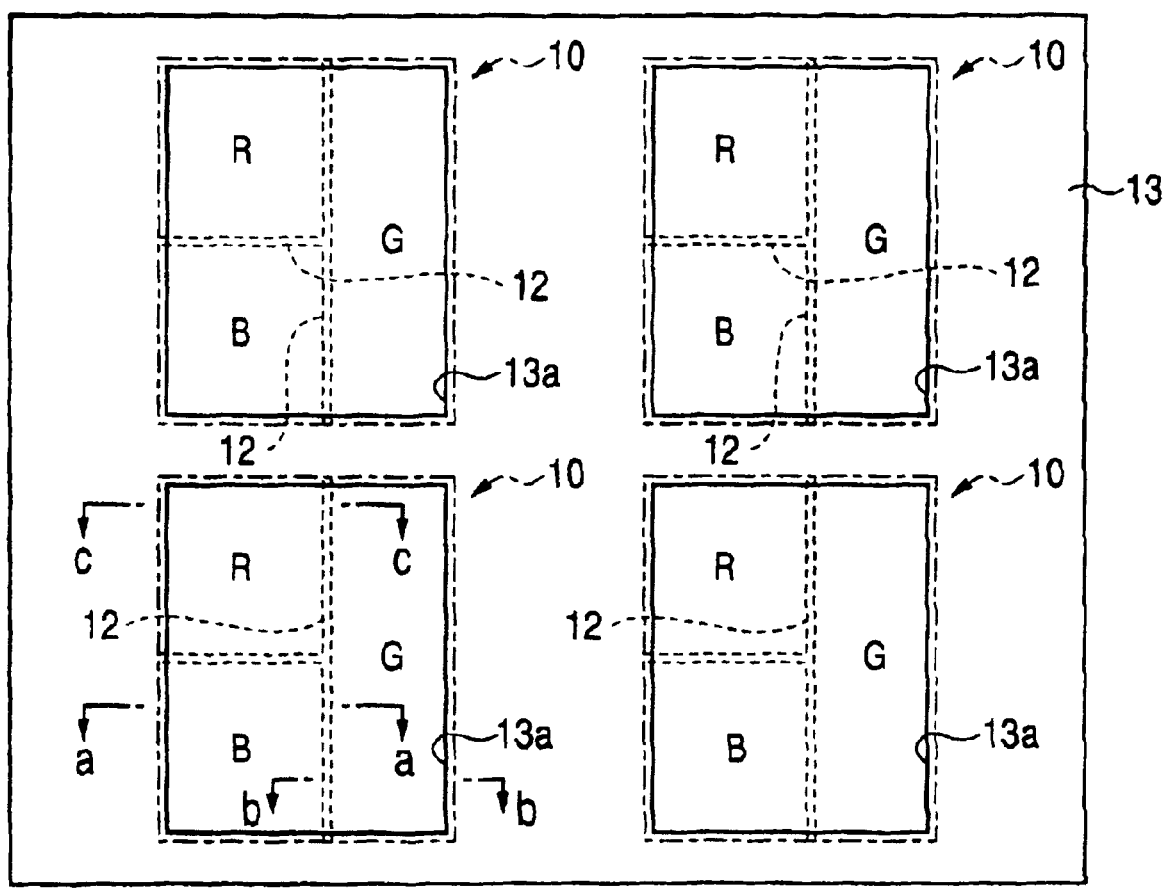
FIG. 17 is an enlarged plan view of the principal section of a color solid-state image pickup device according to a ninth embodiment of the invention.

FIG. 17 is an enlarged plan view of the principal section of a color solid-state image pickup device according to a ninth embodiment of the invention. The small pixels R, G, and B employed in the respective embodiments are configured to be imparted with spectral sensitivities through use of color filters. In the present embodiment, the small pixels are imparted with spectral sensitivities R, G, and B by means of a photodiode structure of the small pixel. The present embodiment illustrates an example in which the plurality of pixel sections 10 are arranged in a square grid pattern.

Figure 18:
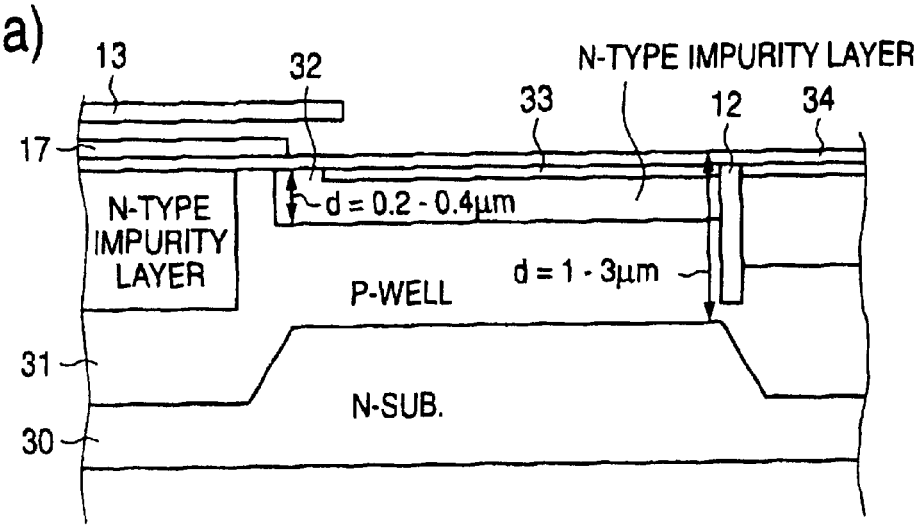
FIG. 18A is a cross-sectional view taken along line a-a shown in FIG. 17.
FIG. 18B is a cross-sectional view taken along line b-b shown in FIG. 17.
FIG. 18C is a cross-sectional view taken along line c-c shown in FIG. 17.
Figure 18:
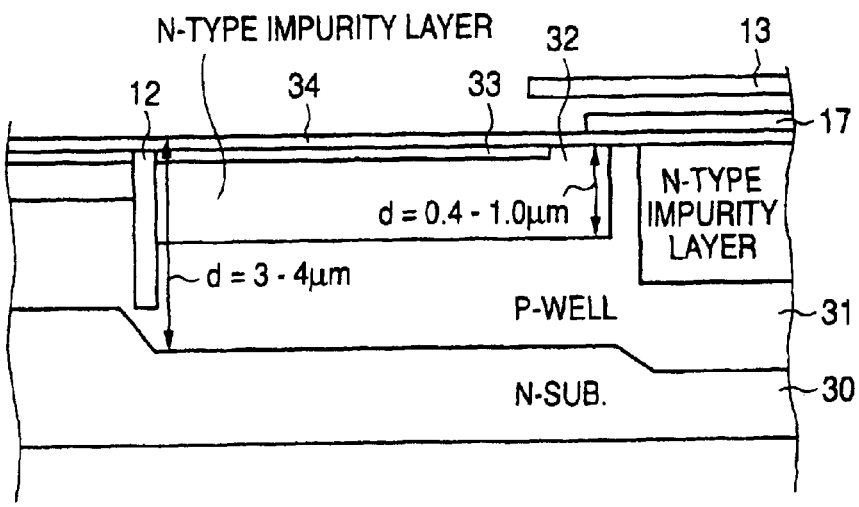
Figure 18:
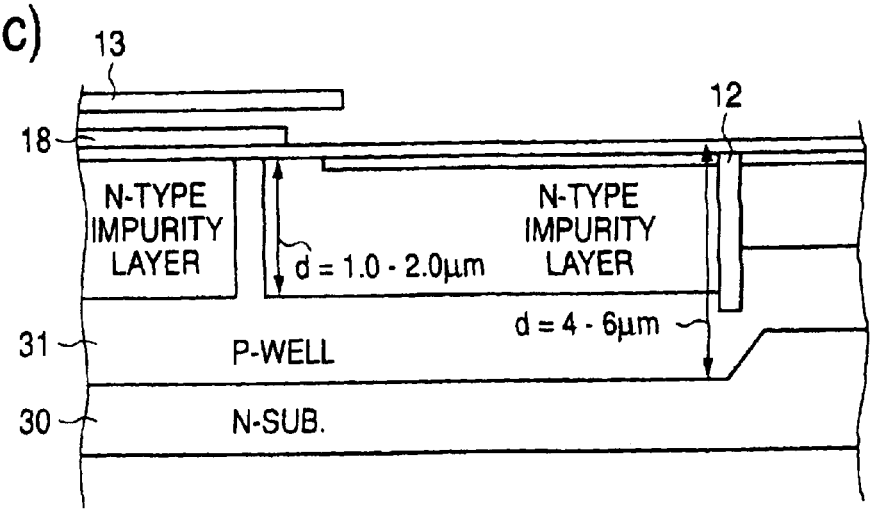

FIGS. 18A, 18B, and 18C show photodiode structures of small pixels B, G, and R according to the ninth embodiment. FIG. 18A is a cross-sectional view of a small pixel having a spectral sensitivity of a blue (B) color, showing a cross section taken along line a-a shown in FIG. 17. FIG. 18B is a cross-sectional view of a small pixel having spectral sensitivity of a green (G) color, showing a cross section taken along line b-b shown in FIG. 17. FIG. 18C is a cross-sectional view of a small pixel having spectral sensitivity of a red (R) color, showing a cross section taken along line c-c shown in FIG. 17.

In the color solid-state image pickup devices of the first through eighth embodiments, the photodiode structures constituting the respective small pixels are made identical with each other, and the small pixels are given spectral sensitivities through use of color filters. In contrast, the small pixel of the embodiment is given a spectral sensitivity by means of selecting the depth of a p-n junction of the photodiode constituting each small pixel. Moreover, the depth of the p-well layer is also selected according to the spectral sensitivity.

The small pixel having spectral sensitivity of a blue (B) color (shown in FIG. 18A) is formed by forming a p-well layer 31 having a depth of d=1 to 3 μm in an n-type silicon substrate (N-Sub) 30; forming an n-type impurity layer 32 having a depth of d=0.2 to 0.4 μm in the surface of the p-well layer 31; forming a heavily-doped p-type impurity layer (surface P$^+$) layer 33 to a predetermined depth in the surface of the impurity layer 32; and covering the top surface with a transparent oxide film 34.

The small pixel (FIG. 18B) having spectral sensitivity of a green (G) color is formed by means of forming the p-well layer 31 having a depth of d=3 to 4 μm in the n-type silicon substrate (N-Sub) 30; forming the n-type impurity layer 32 having a depth of d=0.4 to 1.0 μm in the surface of the p-well layer 31; forming the surface P$^+$ layer 33 to a predetermined depth in the surface of the impurity layer 32; and covering the top surface with the transparent oxide film 34.

The small pixel having spectral sensitivity of a red color (R) (FIG. 18C) is formed by means of forming the p-well layer 31 having a depth of d=4 to 6 μm in the n-type silicon substrate (N-Sub) 30; forming the n-type impurity layer 32 having a depth of d=1.0 to 2.0 μm in the surface of the p-well layer 31; forming the surface P$^+$ layer 33 to a predetermined depth in the surface of the impurity layer 32; and covering the top surface with the transparent oxide film 34.

Light falls on the p-n junction section constituting each of the small pixels R, G, and B, whereupon electric charges are stored in the n-type impurity layer 32 of the p-n junction. The longer the wavelength of light, the deeper the entry of the light into the substrate. Electric charges corresponding to the quantity of blue light are stored in the small pixel (FIG. 18A) having a shallow p-n junction surface; electric charges corresponding to the quantity of green light are stored in the small pixel (FIG. 18B) having a p-n junction surface of intermediate depth; and electric charges corresponding to the quantity of red light are stored in the small pixel (FIG. 18C) having the deepest p-n junction surface.

Setting the spectral characteristics (see FIG. 19) of the respective small pixels such that attenuation arises in long-wave ranges of the spectral characteristics is important for effecting faithful processing of a color signal. To this end, in the embodiment, the depth of the p-well layer 31 is changed in accordance with the respective spectral characteristics. Specifically, the p-well layer 31 is made progressively deeper in the sequence shown in FIGS. 18A, 18, and 18C.

Consequently, in the photodiode structure shown in FIG. 18A, the electric charges produced by the light having a wavelength longer than that of the green (G) light flow into the n-type substrate 30. In the photodiode structure shown in FIG. 18B, the electric charges produced by the light having a wavelength longer than that of the red (R) light flow into the n-type substrate 30. Similarly, in the photodiode structure shown in FIG. 18C, the electric charges produced by the light having an infrared wavelength other than visible light wavelengths flow into the n-type substrate 30. Thus, attenuation characteristics are realized in the long-wave sides of the respective spectral characteristics.

Figure 19:
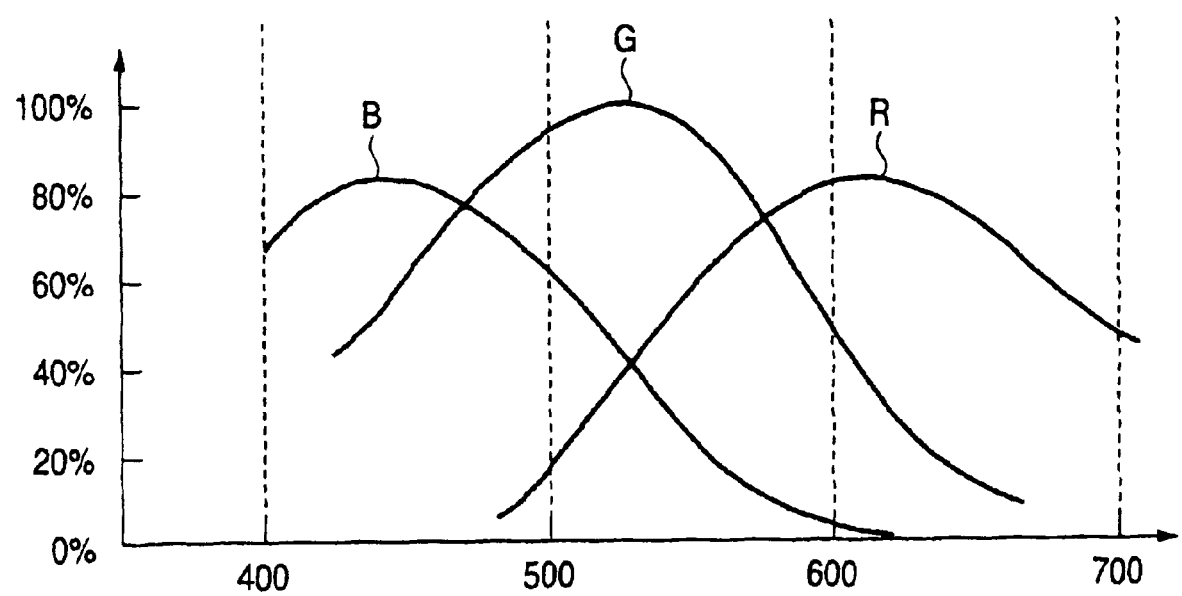
FIG. 19 is a graph showing spectral characteristics of small pixels R, G, and B of a color solid-state image pickup device according to a ninth embodiment of the invention.

As a result, as shown in FIG. 19, the wavelength dependence (spectral characteristic) of the signal electric charges stored in the respective small pixels R, G, and B assumes waveforms which droop at longer wave ranges of the R, G, and B colors, thereby improving color discrimination characteristics. Thus, the color reproducibility of the color signals detected by the small pixels having the spectral characteristics is improved.

In the embodiment, the surface P$^+$ layers 33 located in the respective small pixels R, G, and B are set to equal thicknesses. However, the surface P$^+$ layers 33 of the respective small pixels R, G, and B may be set to different thicknesses.

Needless to say, as in the case of the previously-described embodiments, even in this embodiment the arrangement of the small pixels R, G, and B within the pixel section 10 and the manner of partitioning the pixel section 10 into small pixels are arbitrary. The arrangement of the small pixels may be changed cyclically, or the areas of the small pixels may be changed. Moreover, the pixel sections may be provided in a honeycomb pattern.

Tenth Embodiment

Figure 20:
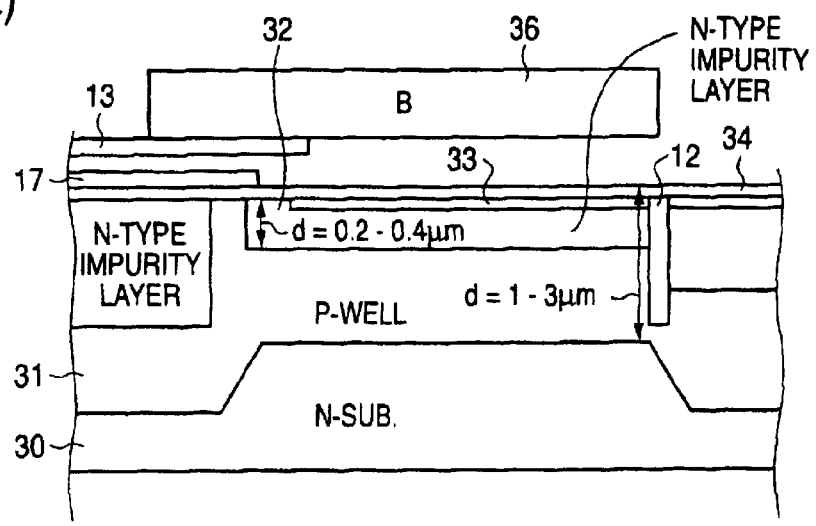
FIG. 20 is a cross-sectional view of small pixels R, G, and B of a color solid-state image pickup device according to a tenth embodiment of the invention.
Figure 20:
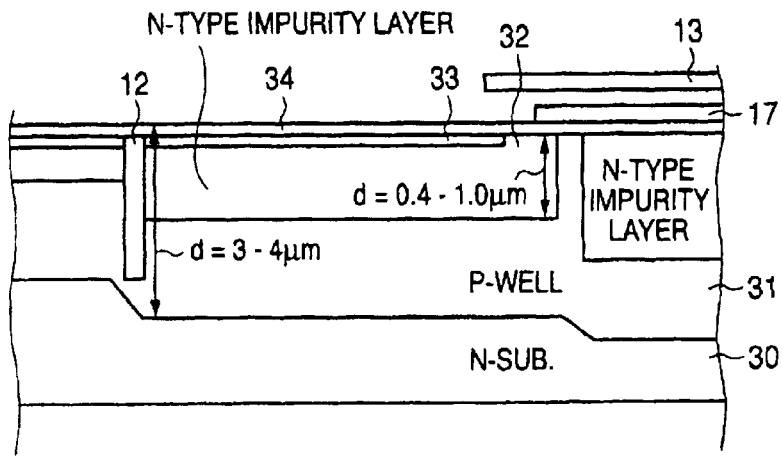
Figure 20:
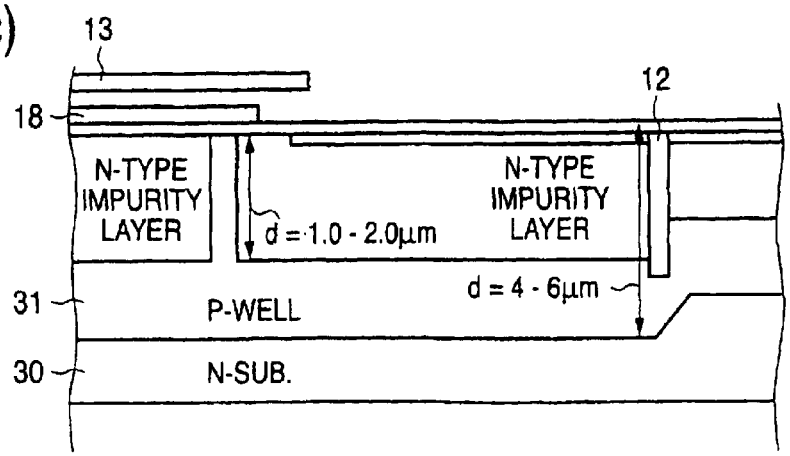

FIGS. 20A, 20B, and 20C are cross-sectional views of a color solid-state image pickup device according to a tenth embodiment of the invention. The color solid-state image pickup device is basically identical with that of the ninth embodiment shown in FIGS. 18A, 18B, and 18C. As shown in FIG. 20A, the only difference between the ninth and tenth embodiments lies in that the color filter 36 of a blue (B) color is provided on the small pixel having spectral sensitivity of a blue (B) color, thereby shaping the spectral characteristic B of the photodiode structure into a sharper waveform by means of the color filter 36. When only one of the spectral characteristics of the R, G, and B colors has been made sharper, color reproducibility is improved further. Alternatively, a green color filter may also be provided on the small pixel G.

Eleventh Embodiment

Figure 21:
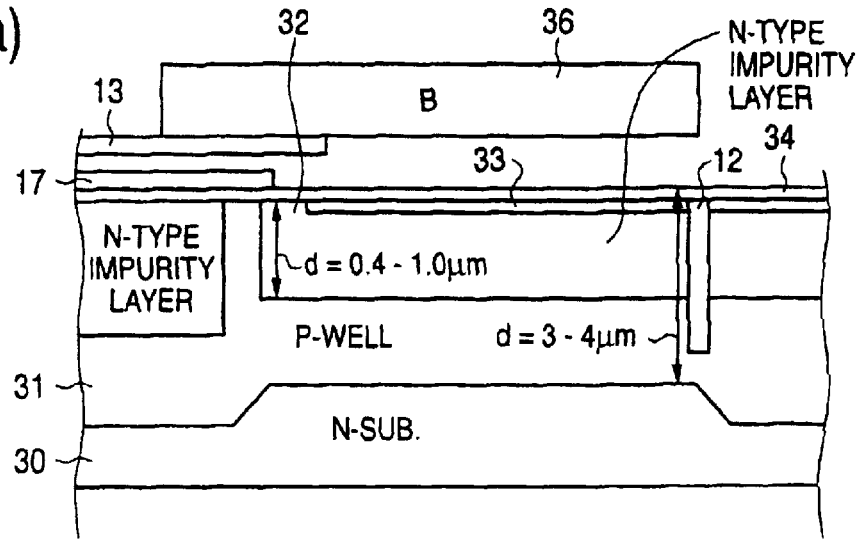
FIG. 21 is a cross-sectional view of small pixels R, G, and B of a color solid-state image pickup device according to an eleventh embodiment of the invention.
Figure 21:
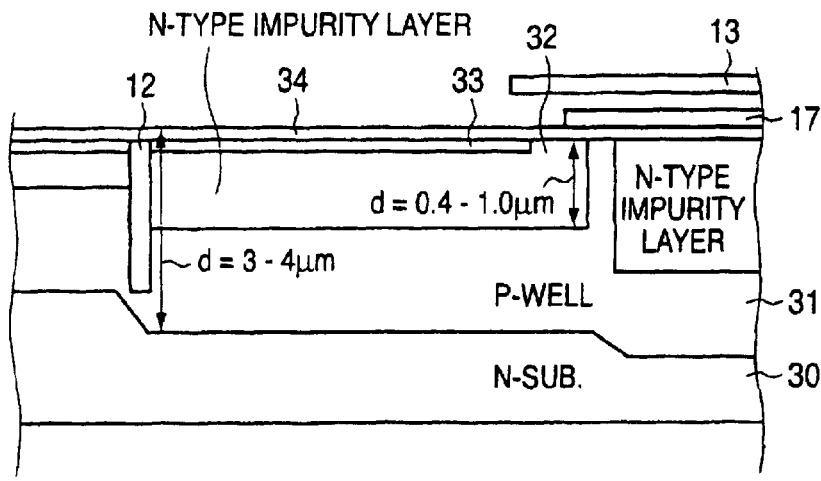
Figure 21:
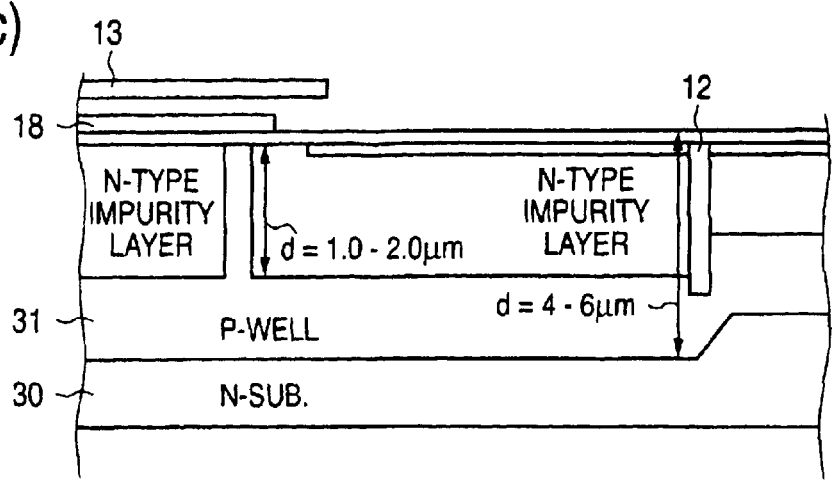

FIGS. 21A, 21B, and 21C are cross-sectional views of a color solid-state image pickup device according to an eleventh embodiment of the invention. The color solid-state image pickup device is basically identical with that of the tenth embodiment shown in FIGS. 20A, 20B, and 20C. As shown in FIG. 21A, the only difference between the tenth and eleventh embodiments lies in that the diode structure of the small pixel having the B spectral sensitivity (e.g., the depth of the p-well layer 31 or the depth of the n-type impurity layer 32) is identical with that of the small pixel G (FIG. 21B). The photodiode structures of the small pixels B, G are optimized so as to have the G spectral sensitivity. Even when the small pixel B has been optimized so as to have the G spectral sensitivity, electric charges corresponding to the quantity of blue light are stored by means of the blue color filter 36. According to the embodiment, there is yielded an advantage of the ability to manufacture the small pixel B and the small pixel G so as to assume identical structures, thereby facilitating manufacturing processes.

Twelfth Embodiment

Figure 22:
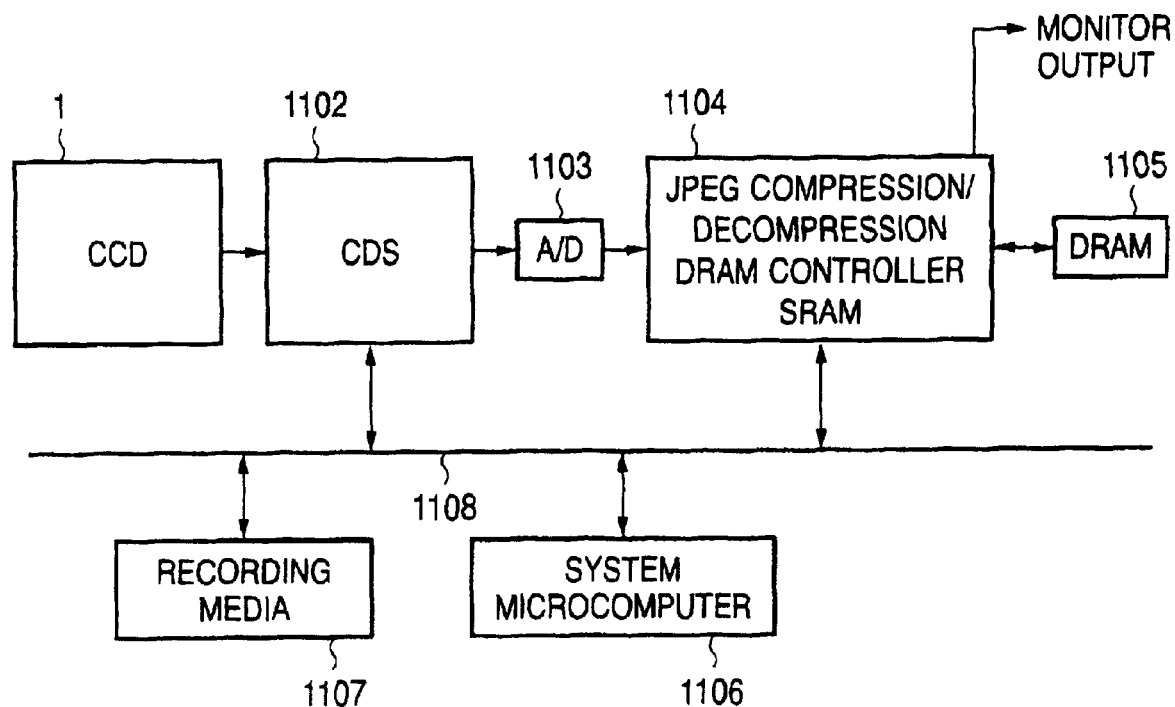
FIG. 22 is a block diagram of a digital camera according to an embodiment of the invention.

FIG. 22 is a block diagram of a digital camera according to an embodiment of the invention. A digital camera, such as a digital still camera, a digital video camera, or a camera incorporated into a compact electronic device such as a portable cellular phone, comprises: a color solid-state image pickup device 1 of single chip type according to any one of the above-mentioned embodiments, the device receiving an optical signal of a subject's image formed by an unillustrated light-gathering optical system and converting the thus-received signal into an electrical signal; an analog signal processing circuit 1102, such as a CDS, which subjects an image signal output from the solid-state image pickup device 1 to analog processing; an analog-to-digital conversion circuit 1103 which converts an image signal processed by the analog signal processing circuit 1102 into a digital image signal; a digital processing circuit 1104 which acquires the digitized image signal and subjects the signal to JPEG compression, decompression, or DRAM control; DRAM 1105 connected to the digital processing circuit 1104; a system microcomputer 1106 for controlling an overall digital camera in a centralized manner; a recording medium 1107 for recording photographed image data; and a bus 1108 for interconnecting these constituent elements.

According to the digital camera of the embodiment, the foregoing small pixels of the color solid-state image pickup device 1 output R, G, and B color signal components. Therefore, the digital camera can photograph a high-sensitivity, high-resolution color image which enables faithful color reproduction while suppressing occurrence of a false signal (Moiré) and a false color.

Twelfth Embodiment

Figure 23:
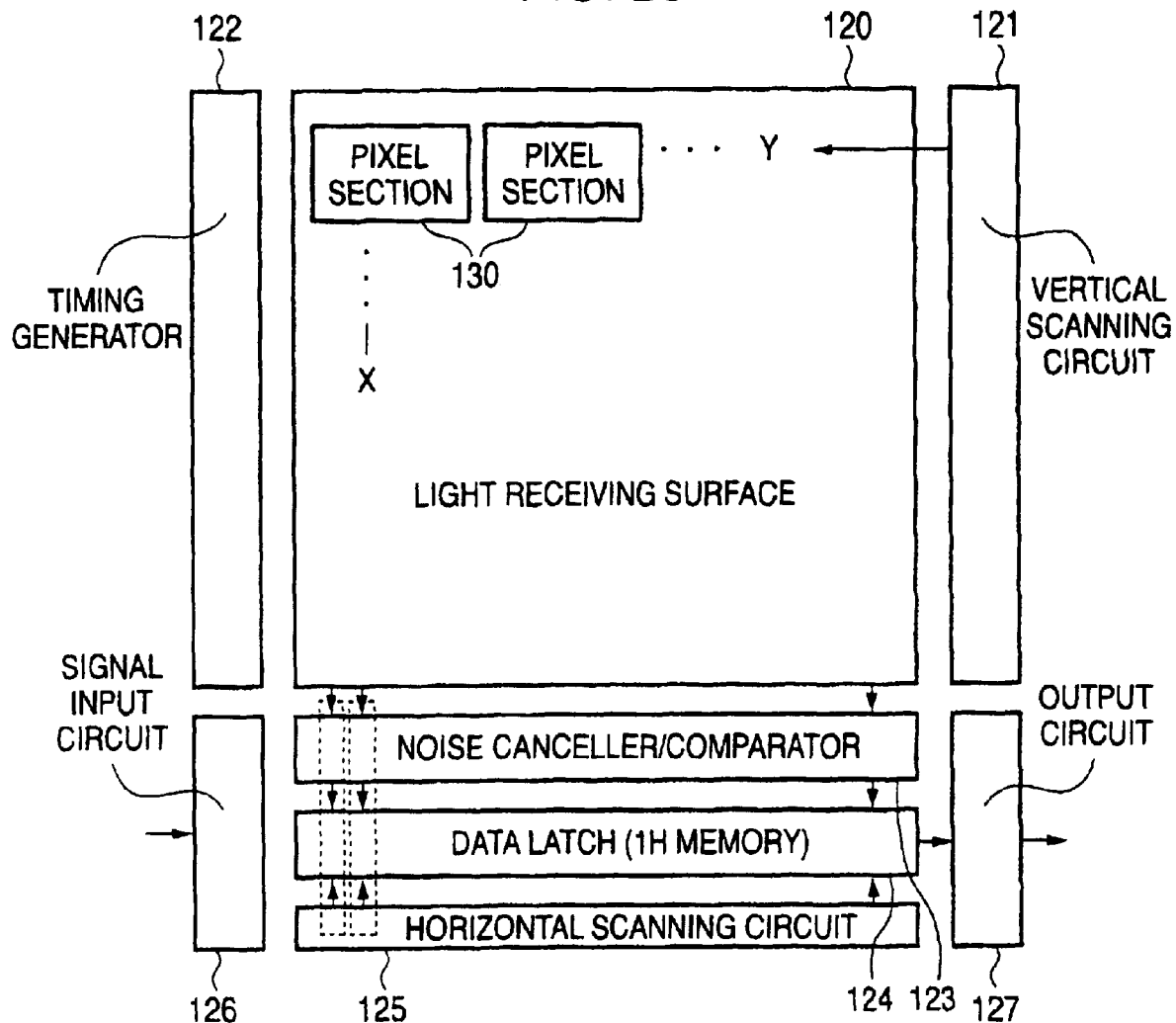
FIG. 23 is a block diagram of a CMOS image sensor according to a first embodiment of the invention.

FIG. 23 is a block diagram of a color CMOS image sensor of single chip type according to a twelfth embodiment of the invention. In this embodiment, photoelectric conversion regions 130 to be described in detail later (individual photoelectric conversion regions will hereinafter be called pixel sections) are provided and arranged, in a square grid pattern, on the surface of a semiconductor substrate constituting a light-receiving surface 120 of a CMOS image sensor according to the embodiment. The inside of each pixel section 130 is two-dimensionally partitioned into a plurality of segments having a plurality of different spectral sensitivities (the segments will also be called "small pixels").

A vertical scanning circuit 121 and a timing generator 122 are provided beside a light-receiving surface 120. A noise cancel circuit 123, a data latch circuit 124, and a horizontal scanning circuit 125 are provided in positions along one vertical end of the light-receiving surface 120. A signal input circuit 126 is provided on one end of the data latch circuit 124 and the horizontal scanning circuit 125, and an output circuit 127 is provided at the other end of the same.

Figure 24:
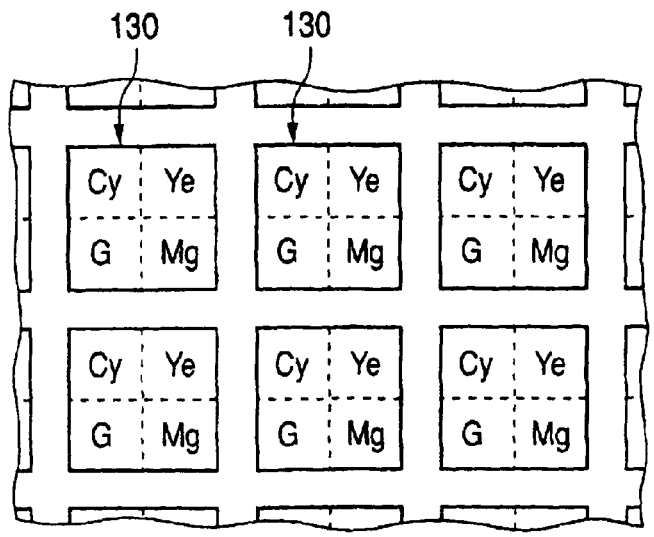
FIG. 24 is a view showing an example arrangement of spectral sensitivities within respective pixel sections of the CMOS image sensor shown in FIG. 1.
Figure 25:
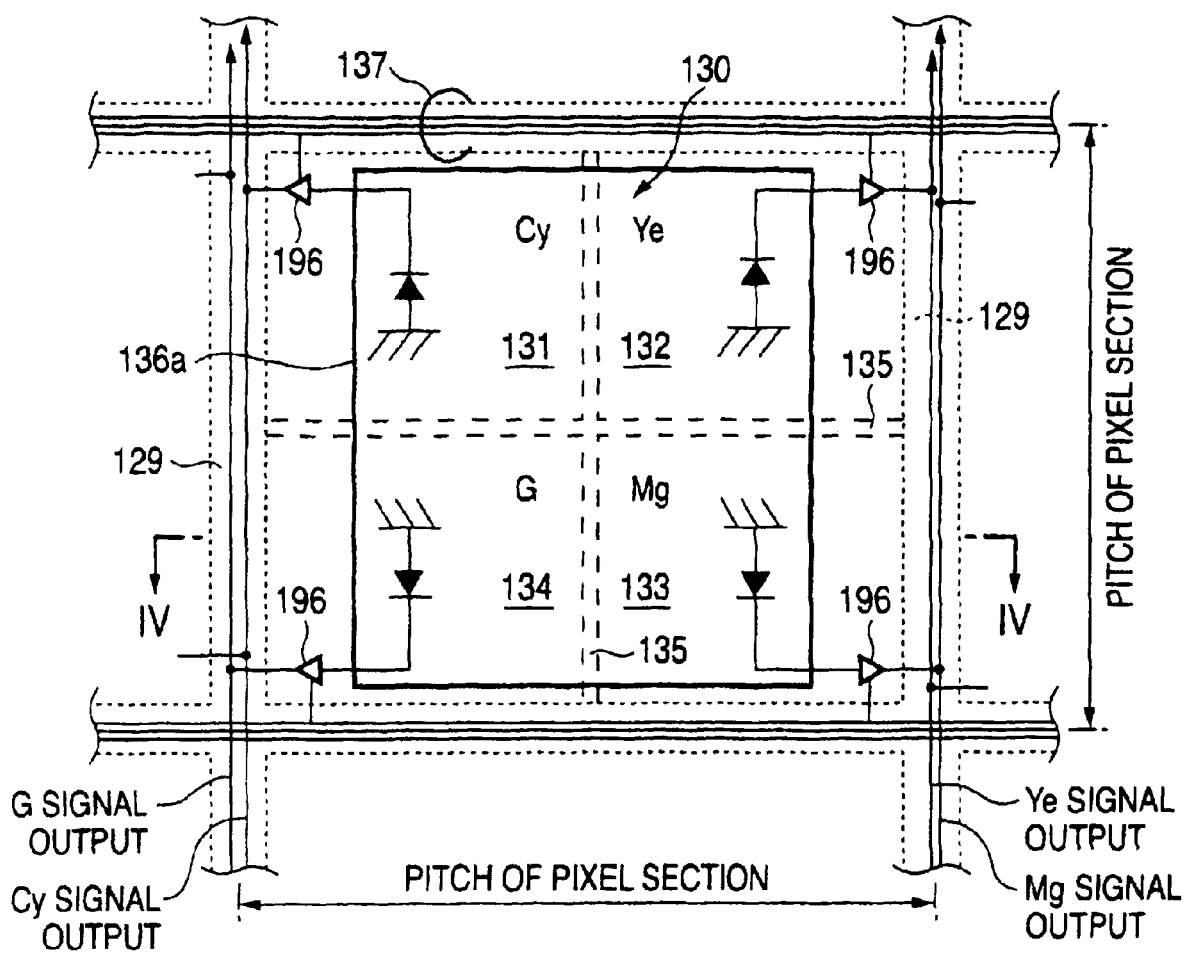
FIG. 25 is an enlarged descriptive view of one pixel section of the CMOS image sensor shown in FIG. 1.

FIG. 24 is a view showing an example arrangement of spectral sensitivities within the respective pixel section 130 arranged in a square grid pattern. FIG. 25 is an enlarged descriptive view of one pixel section 130. The pixel section 130 of the CMOS image sensor of the embodiment is configured to capture an image signal through use of four complementary color filters (Cy, Ye, G, and Mg). In this embodiment, as shown in FIG. 25, a Cy small pixel 131, a Ye small pixel 132, an Mg small pixel 133, and a G small pixel 134 are isolated from each other by means of only an element isolation zone 135, thereby realizing an adjacent arrangement. For each of the small pixels 131, 132, 133, and 134, the peripheral circuit section 196 and a reset circuit are formed around the pixel sections 130.

A black frame line 136a shown in FIG. 25 shows one aperture of the light-shielding film. In the embodiment, apertures are formed in the light-shielding film so as to be assigned to the respective pixel sections 130. Individual apertures are not provided for the respective small pixels 131, 132, 133, and 134 in each pixel section 130. The peripheral circuit 196 or the like provided for the respective small pixels 131, 132, 133, and 134 is provided around the pixel section 130 and not between the small pixels 131, 132, 133, and 134 within one pixel section 130.

Figure 26:
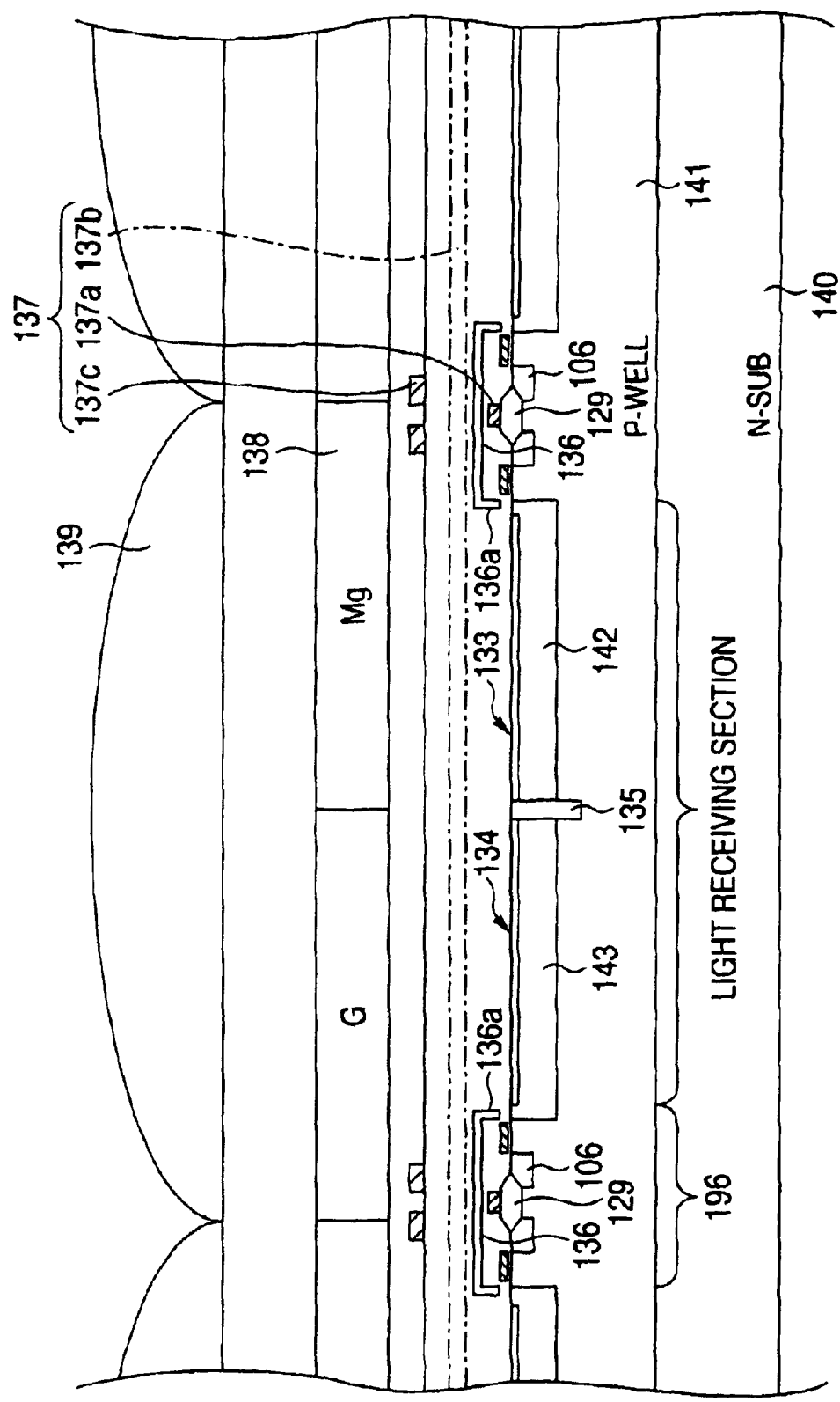
FIG. 26 is a cross-sectional view taken along line IV-IV shown in FIG. 3.

FIG. 26 is a cross-sectional view taken along line IV-IV shown in FIG. 25. A p-well layer 141 is formed on the surface of an n-type semiconductor substrate 140. N-type impurity layers 142, 143 are formed on the surface of the p-well layer 141. A p-n junction for a small pixel (photodiode in this embodiment) 133 is formed between the n-type impurity layer 142 and the p-well layer 141, and a p-n junction for a small pixel (photodiode) 134 is formed between the n-type impurity layer 143 and the p-well layer 141. As a result of light having fallen on the p-n junction sections, signal electric charges corresponding to the incident light are stored in the n-type impurity layers 142, 143.

The n-type impurity layers 142, 143 are isolated from each other by means of the element isolation zone 135 formed from a heavily-doped p-type impurity layer ($P^+$) area. The peripheral circuits 196 are fabricated on the sides of the n-type impurity layers 142, 143 opposite their sides facing the element isolation zone 135. A first wiring section 137a is laid on the surface of the semiconductor substrate provided with the peripheral circuits 196. A light-shielding film 136 is provided over the peripheral circuits 196 and the first wiring section 137a, to thus inhibit incidence of light on the peripheral circuits 196. The pixel sections 130 are isolated from each other by means of locally-oxidized silicon (LOCOS) 129.

A color filter 138 is provided at a position above the small pixels 133, 134. A second wiring section 137b and a third wiring section 137c are stacked with an interlayer insulation film sandwiched therebetween at a position which is located between the color filter 138 and the light-shielding film 136 and avoids the aperture 136a of the light-shielding film. A microlens (top lens) 139 is provided on the third wiring section 137c via a planarized film.

As mentioned above, according to the embodiment, a plurality of small pixels 131; 132, 133, and 134 are arranged at one area in a concentrated manner, to thus constitute one pixel section 130. The distance between the small pixels within one pixel section is made shorter than that between the small pixels within adjacent pixel sections. Hence, even when an attempt is made to increase resolution by means of miniaturizing the small pixels 131, 132, 133, and 134, the apertures 136a of the light-shielding film 136 can be made large, to thereby enable photographing of a high-sensitivity image. Even when a diameter "t" (diameter or a diagonal line length) of each aperture 136a is made fine up to, e.g., t=λ~2λ with reference to the wavelength λ (mm) of a red color, output signals of three to four colors corresponding to respective color components are not attenuated.

The small pixels 131, 132, 133, and 134 are two-dimensionally partitioned by means of the element isolation zone 135 of minimum processing dimension. The distance between small pixels can be shortened and occurrence of a false color can be inhibited even when manufacturing processes, a design rule, and a chip size are identical with those employed in the related art.

Moreover, in the embodiment, the small pixels 131, 132, 133, and 134 are arranged in a concentrated manner, and the peripheral circuits, the signal lines, and the control lines are arranged around the small pixels. Hence, the area of a photoelectric conversion section relative to a chip area of the semiconductor substrate can be made broader than that achieved in the related art, thereby improving the utilization efficiency of incident light.

Further, in the CMOS image sensor of the embodiment, an entrance channel for incident light in each pixel section 130 is broadened (presence of a signal line and a control line hinders entrance of light in a related-art CMOS image sensor, but in the embodiment the signal line does not impede incidence of light on the small pixels within the pixel section 30). For this reason, sufficient sensitivity can be achieved without use of a microlens 139. Use of the microlens 139 enables a further improvement in the utilization efficiency of incident light.

In the embodiment shown in FIG. 26, oblique incident light having passed through, e.g., an Mg color filter, falls also on the G small pixel 134. However, in the CMOS image sensor of the embodiment, the only requirement is to ascertain a rough proportion of Ye, Cy, Mg, and G in the light that has fallen on one pixel section, and detection of a strict proportion is not required. Consequently, the microlens 139 is provided for each aperture 136a such that one microlens 139 covers the entirety of one aperture 136a of the light-shielding film 136. Further, another requirement is to merely gather incident light within a corresponding aperture 136a, thereby facilitating manufacture of a microlens.

The geometry of the pixel section 130, the number of small pixels into which the pixel section 130 is two-dimensionally partitioned, and the geometry of the small pixels are not limited to the examples shown in FIG. 25. Any geometry or number may be employed, so long as a pixel section is formed by placing small pixels adjacent to each other. As shown in FIG. 25, the embodiment has described an active CMOS image sensor in which amplifiers (peripheral circuits) 196 are provided for respective small pixels. The invention can also be applied to a passive CMOS image sensor in which small pixels have no amplifier. Moreover, the pixel sections 130 may be arranged, on the surface of the light-receiving surface 120 of the CMOS image sensor, in the square grid pattern shown in FIG. 23 or a so-called honeycomb pattern into which the square grid pattern is tilted through 45°. The same also applies to counterparts in the following embodiments.

Thirteenth Embodiment

Figure 27:
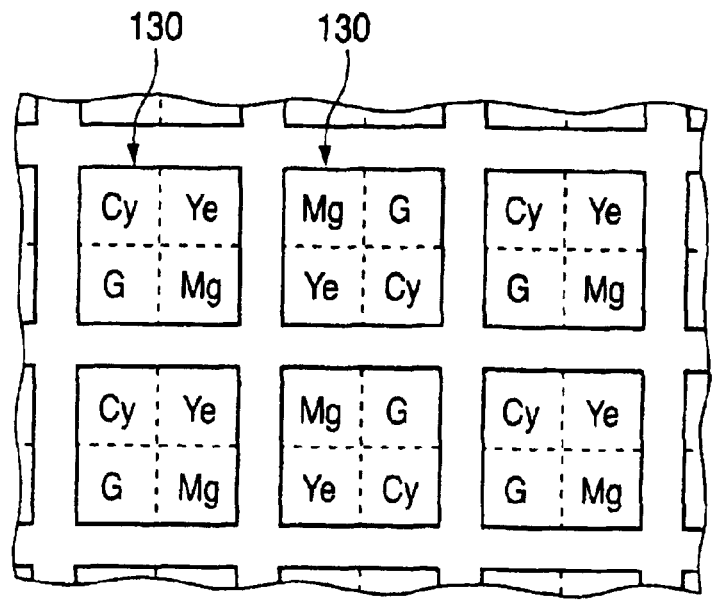
FIG. 27 is a view showing an example arrangement of spectral sensitivities within each pixel section of the CMOS image sensor according to a second embodiment of the invention.

FIG. 27 is a view showing an example arrangement of spectral sensitivities within each pixel section 130 according to a thirteenth embodiment of the invention. In the twelfth embodiment, as shown in FIG. 24, the spectral sensitivities within each pixel section 130 are arranged in the same pattern within all the pixel sections 130. However, in this embodiment, the arrangement of spectral sensitivities within each pixel section 130 (i.e., the arrangement of color filters in the embodiment) is changed in a regular pattern. As a result, a cyclic false signal stemming from the arrangement of spectral sensitivities can be diminished.

Conceivable methods for changing the arrangement of color filters are:

(1) alternately switching of longitudinal and lateral color layouts on a per-column or per-row basis in the pixel section; and (2) changing the arrangement of a color filter corresponding to a short wavelength and that of a color filter corresponding to a long wavelength at the center and periphery of the light-receiving surface 120, thereby alleviating shading of light, which arises in the periphery of the light-receiving surface 120 or the periphery of a light-shielding aperture.

When the arrangements of color filters have been changed, color components included in read pixel signals are also changed. Proper processing of color signals can be effected by imparting to an external processing circuit data pertaining to a change in the arrangements. This embodiment can also be used in combination with subsequent embodiments.

Fourteenth Embodiment

Figure 28:
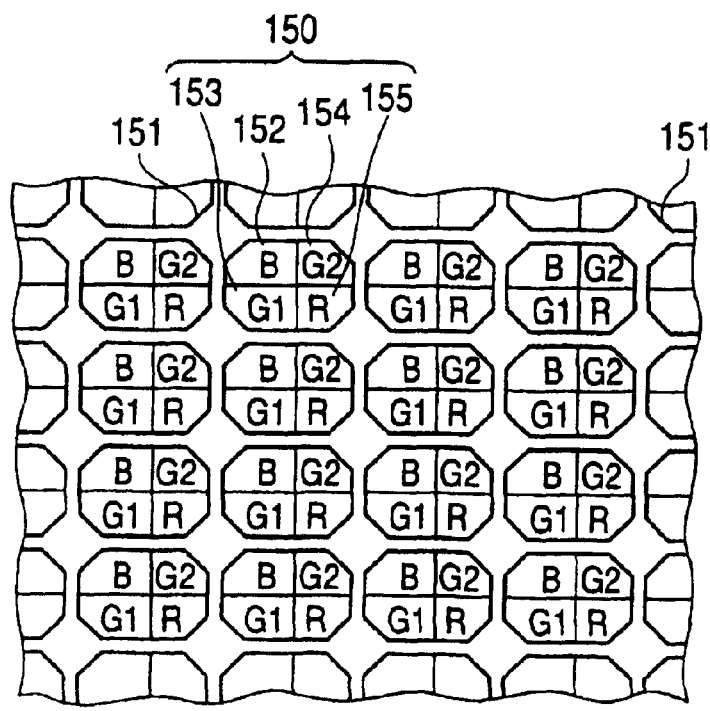
FIG. 28 is a block diagram of a CMOS image sensor according to a third embodiment of the invention.

FIG. 28 is a block diagram of a CMOS image sensor according to a fourteenth embodiment of the invention. In the twelfth embodiment, the peripheral circuits 196 are fabricated in strip-shaped areas provided on both sides of the pixel section 130. In the embodiment, the peripheral circuits 196 are formed at corners of the respective rectangular pixel sections 150 in a concentrated manner.

Figure 29:
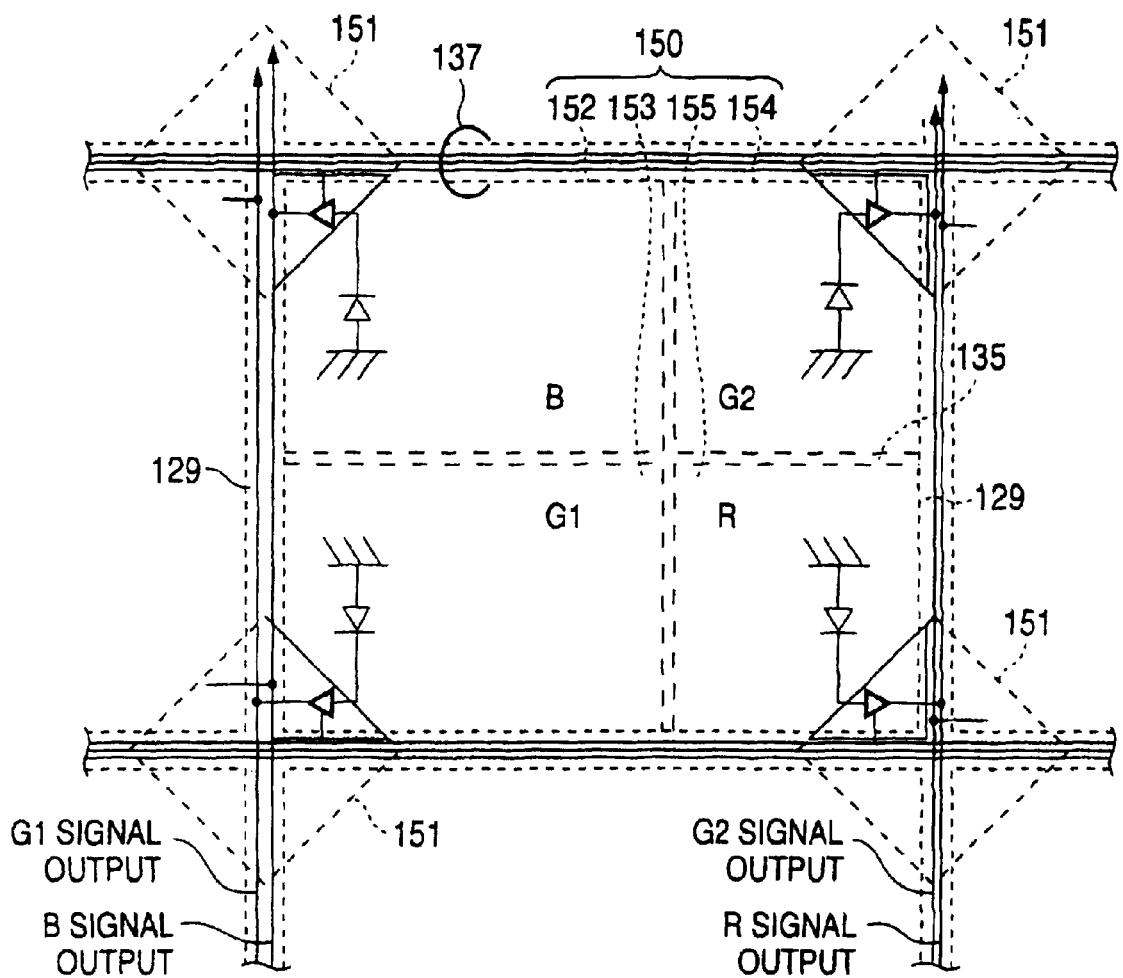
FIG. 29 is an enlarged view of one pixel section shown in FIG. 28.

FIG. 29 is an enlarged view of one pixel section 150 and adjacent areas of the adjacent pixel sections 150. This embodiment shows an example in which primary-color-based color filters are used (R, G1, G2, and B: two kinds of color filters G1, G2 are used as the green filter G).

A reset circuit and a power supply circuit, both constituting peripheral circuits, contacts, and wiring portions can be made common or simplified by arranging the peripheral circuits at corners of respective photoelectric conversion sections in a concentrated manner as mentioned above. The area of the photoelectric conversion sections accounting for the chip area of the CMOS image sensor becomes larger, whereby the area utilization efficiency is improved as compared with the twelfth embodiment.

In the twelfth embodiment, the small pixels 131, 132, 133, and 134 constituting the pixel section 130 are made equal in area to each other. In the embodiment, small pixels 152, 153, 154, and 155 constituting a pixel section 150 are made different in area from each other. The areas of the small pixels 152, 153, 154, and 155 are preferably formed so as to be inversely proportional to the magnitude of relative spectral sensitivity per unit area. Specifically, the area of the small pixel to be used for detecting a high-sensitivity color (e.g., the pixel 155 for detecting a red (R) color in the illustrated embodiment) is made small. The area of the photoelectric conversion section 152 for detecting a color having low sensitivity (e.g., a blue (B) color in the illustrated embodiment) is made larger. As a result, a sensitivity balance can be optimized.

Fifteenth Embodiment

Figure 30:
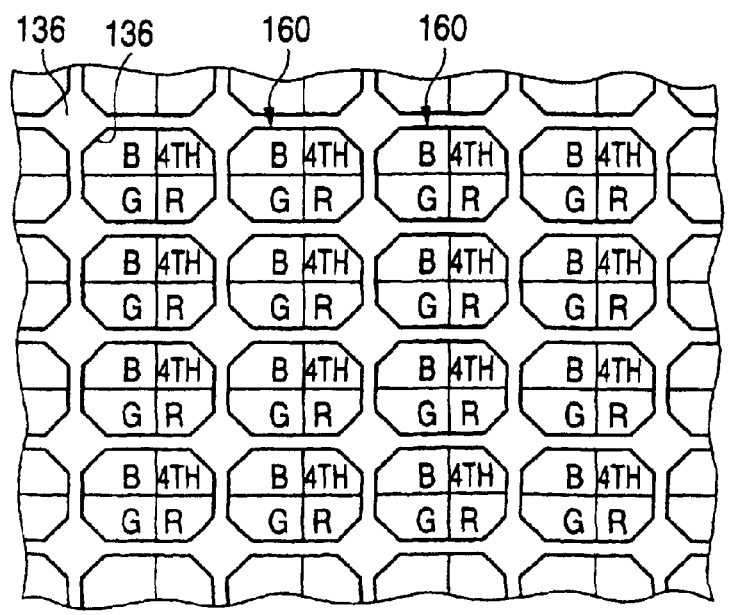
FIG. 30 is a block diagram of a CMOS image sensor according to a fourth embodiment of the invention.

FIG. 30 is a block diagram of a CMOS image sensor according to a fifteenth embodiment of the invention. In the embodiment, each pixel section 160 is provided with a small pixel having a fourth spectral sensitivity, in addition to primary-color-based small pixels (R, G, and B).

The fourth spectral sensitivity of the embodiment is, for example, a spectral sensitivity having a peak around a wavelength of 520 nm as already shown in FIG. 10. Also as described before, FIG. 11 is a graph showing a color matching function (human luminosity). A negative area A is located in the vicinity of 520 nm in connection with a red (R) color. Faithful color reproduction cannot be achieved without materializing the spectral sensitivity of the negative area A. For this reason, according to the embodiment, the amount of signal electric charges corresponding to the quantity of light at a wavelength of about 520 nm is detected by means of a small pixel having the fourth spectral sensitivity. The thus-detected amount of signal electric charges is subtracted from the amount of signal electric charges corresponding to the quantity of red R light, to thereby materialize the spectral sensitivity of the negative area A of the color matching function and enable color representation as perceived by the human eye.

Sixteenth Embodiment

Figure 31:
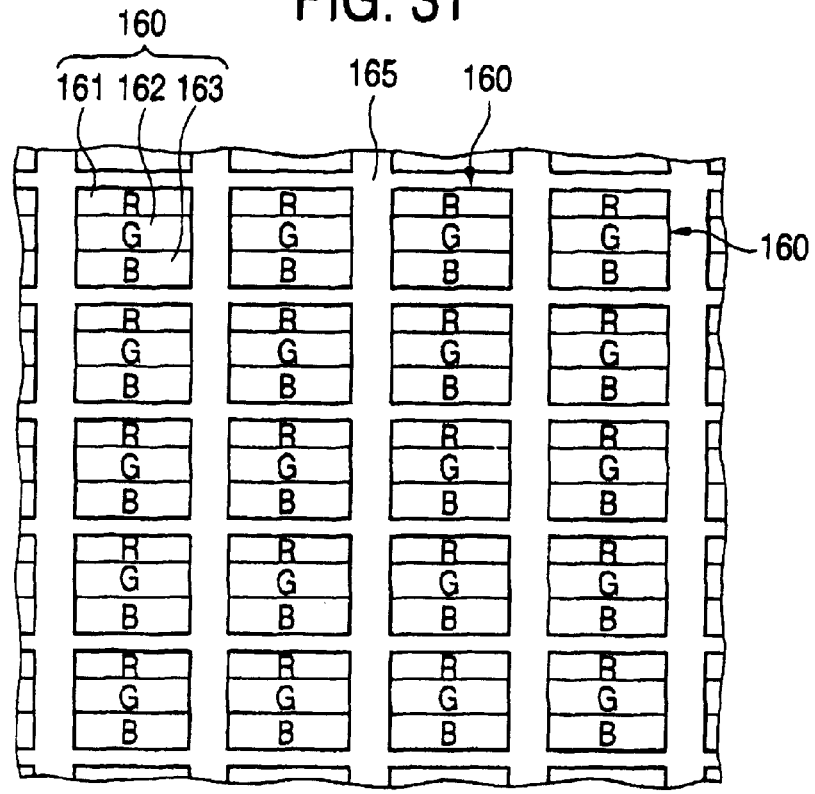
FIG. 31 is a block diagram of a CMOS image sensor according to a fifth embodiment of the invention.
Figure 32:
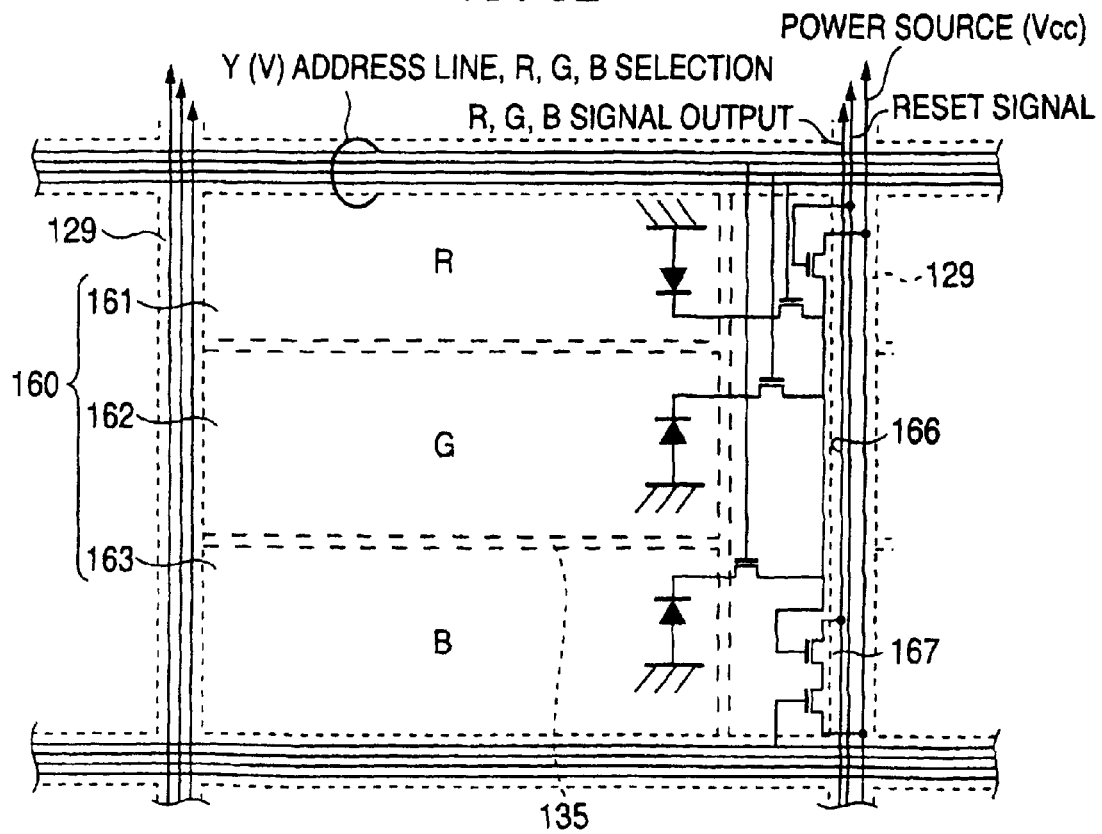
FIG. 32 is an enlarged descriptive view of one pixel section shown in FIG. 31.

FIG. 31 is a block diagram of a CMOS image sensor according to a Sixteenth embodiment of the invention. FIG. 32 is an enlarged descriptive view of one pixel section. The CMOS image sensor of the embodiment uses primary-color-based (R, G, and B) color filters of stripe patterns (FIG. 31 shows a state in which a light-shielding film 165 having apertures to be assigned to the respective pixel sections 160 is placed on the color filter layer of stripe pattern). One pixel section 160 is formed from three small pixels 161, 162, and 163 arranged in a concentrated manner. Peripheral circuits of the small pixels 161, 162, and 163 are formed on the right side of the pixel section 160, whereby the peripheral circuits and wiring regions are shielded by a light-shielding film 165.

In the embodiment, the R, G, and B color signals output from the small pixels 161, 162, and 163 are read with a single signal line 166. As a result, an output amplifier 167 which must be provided as a peripheral circuit can be shared between the small pixels 161, 162, and 163 of the pixel section 160. There are yielded an advantage of the ability to reduce the areas occupied by the peripheral circuits and the ability to eliminate the influence of variations in the characteristics of amplifiers when output amplifiers are provided for the small pixels 161, 162, and 163, respectively.

The present embodiment uses a color filter of stripe pattern, and hence an attempt can be made to miniaturize the color filter and improve manufacturing yield.

Seventeenth Embodiment

Figure 33:
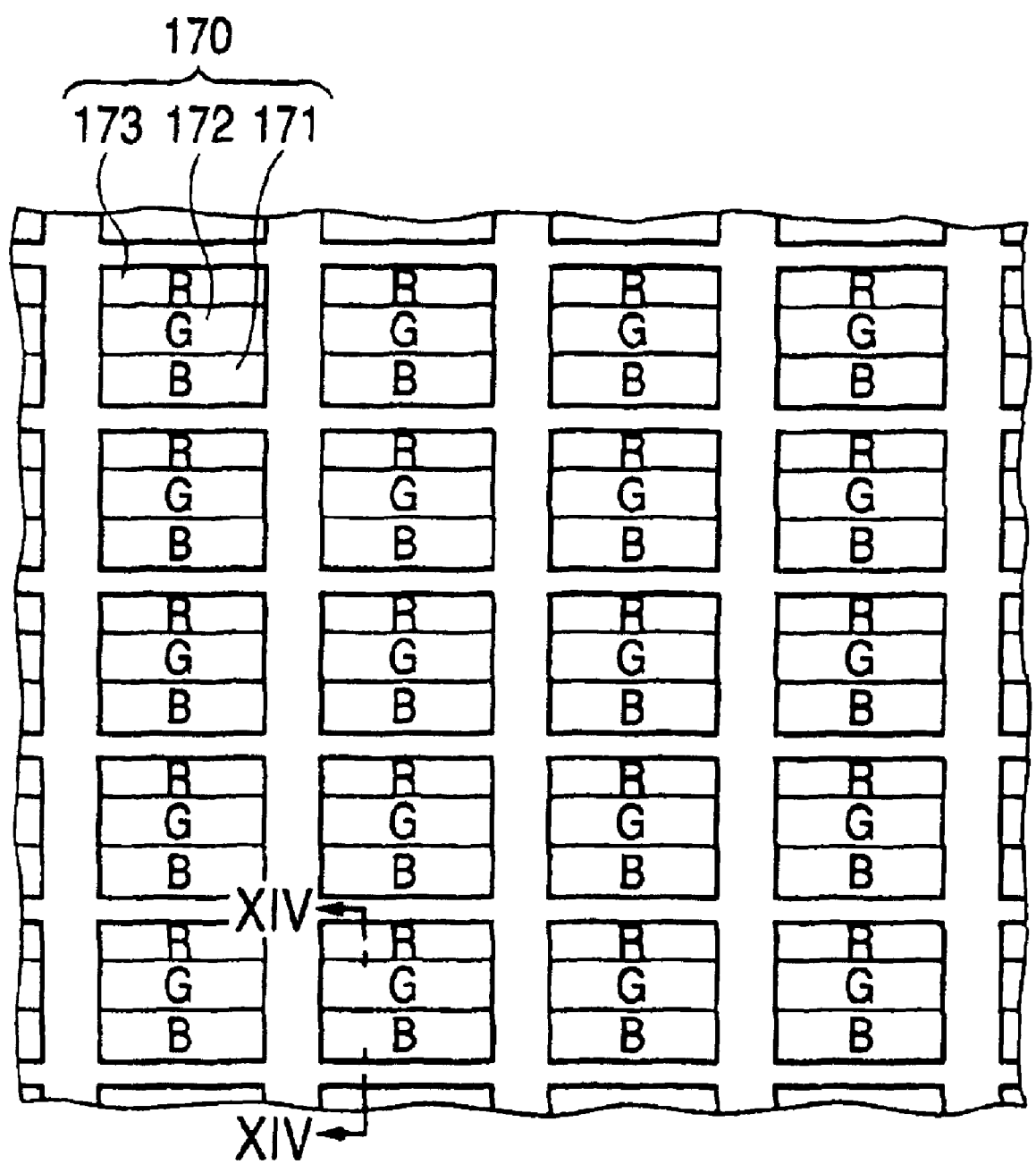
FIG. 33 is a block diagram of a CMOS image sensor according to a sixth embodiment of the invention.

FIG. 33 is a block diagram of a CMOS image sensor according to a seventeenth embodiment of the invention. FIG. 33 is a view similar to the embodiment shown in FIG. 31. In the embodiment, the color filter is not provided, and the spectral sensitivities R, G, and B are imparted by means of photodiode structures of small pixels constituting a pixel section 170.

Figure 34:
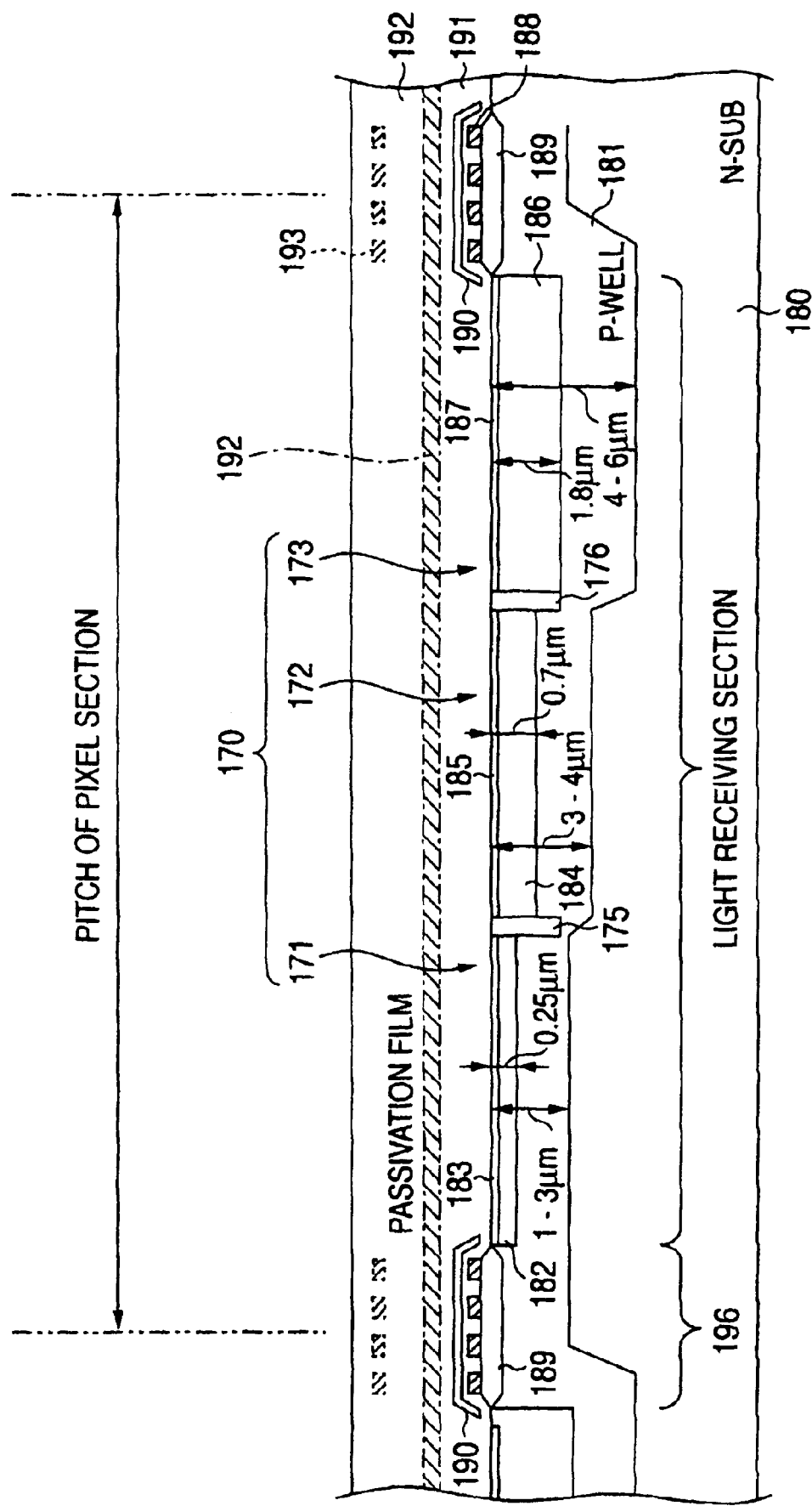
FIG. 34 is a cross-sectional view taken along line XIV-XIV shown in FIG. 33.

FIG. 34 is a cross-sectional view taken along line XIV-XIV shown in FIG. 33. In FIG. 34, a small pixel 171 having blue (B) spectral sensitivity is formed by forming a p-well layer 181 in an n-type silicon substrate (N-Sub) 180 to a depth d=1 to 3 μm, forming an n-type impurity layer 182 in the surface of the p-well layer 181 to a depth of d=0.25 μm, and forming a surface P$^+$ layer 183 in the surface of the n-type impurity layer 182 to a predetermined depth.

A small pixel 72—which has green (G) spectral sensitivity and is isolated from the small pixel 171 by means of the element isolation zone 175 formed from a heavily-doped p-type impurity layer—is formed by means of setting the depth "d" of the p-well layer 181 to be formed in the n-type silicon substrate (N-Sub) 180 to d=3 to 4 μm, forming an n-type impurity layer 184 in the surface of the p-well layer 181 to a depth of d 0.7 μm, and forming a surface P$^+$ layer 185 in the surface of the n-type impurity layer 184 to a predetermined depth.

A small pixel 173, which has red (R) spectral sensitivity and is isolated from the small pixel 172 by means of an element isolation zone 176 formed from a heavily-doped p-type impurity layer—, is formed by setting the depth "d" of the p-well layer 181 to be formed on the n-type silicon substrate (N-Sub) 170 to d=4 to 6 μm, forming an n-type impurity layer 186 in the surface of the P-well layer 181 to a depth of d=1.8 μm, and forming the surface P$^+$ layer 187 in the surface of the n-type impurity layer 186 to a predetermined depth.

Adjacent pixel sections 170 are isolated from each other by means of a locally-oxidized silicon (LOCOS) area 189. A peripheral circuit section (not shown) and a first wiring section 188 are provided between the adjacent pixel sections 170. A light-shielding film 190 covers the first wiring sections 188. A second wiring section 192 stacked on the pixel section 170 via a planarized film 191 is formed at a position avoiding the light-receiving surfaces of the small pixels 171, 172, and 173 (i.e., in an illustrated embodiment, a boundary between this pixel section and an adjacent pixel section existing at a position spaced a distance in a direction away from the viewer of the drawing).

When light falls on the p-n junction sections of the respective small pixels, electric charges are stored in the p-n junction, n-type impurity layers 182, 184, and 186. The longer the wavelength of light, the deeper the entry of the light into the substrate. Electric charges corresponding to the quantity of blue light are stored in the small pixel 171 having a shallow p-n junction surface; electric charges corresponding to the quantity of green light are stored in the small pixel 172 having a p-n junction surface of intermediate depth; and electric charges corresponding to the quantity of red light are stored in the small pixel 173 having the deepest p-n junction surface.

Setting the spectral characteristics of the respective small pixels such that attenuation arises in long-wave ranges of the spectral characteristics is important for effecting faithful processing of a color signal. To this end, in the embodiment, the depth of the p-well layer 181 is changed in accordance with the respective spectral characteristics. Specifically, the p-well layer 181 is made progressively deeper in the sequence of the small pixels 171, 172, and 173 which detect blue (B), green (G), and red (R) light. Consequently, the optical electric charges produced in the small pixel 171 by the light having a wavelength longer than that of the green (G) light flow into the n-type substrate 180. The optical electric charges produced in the small pixel 172 by the light having a wavelength longer than that of the red (R) light flow into the n-type substrate 180. Similarly, the optical electric charges produced in the small pixel 173 by the light having an infrared wavelength other than visible light wavelengths flow into the n-type substrate 180.

Wavelength dependence (spectral characteristic) of signal electric charges stored in the respective small pixels 171, 172, and 173 assumes waveforms which droop at short wave ranges and longer wave ranges of the R, G, and B colors, thereby improving color discrimination characteristics as already shown in FIG. 19. Thus, the color reproducibility of the color signals detected by the photoelectric conversion sections having such spectral characteristics is improved.

In the embodiment, the surface $P^+$ layers provided on the surfaces of the respective small pixels 171, 172, and 173 are set to an equal thicknesses. However, the surface P+ layers of the respective small pixels 171, 172, and 173 may be made progressively deeper, in this sequence. In the seventeenth embodiment, the microlens is not provided. However, as in the case of the twelfth embodiment, a microlens may be provided for each aperture of the light-shielding film.

Eighteenth Embodiment

Figure 35:
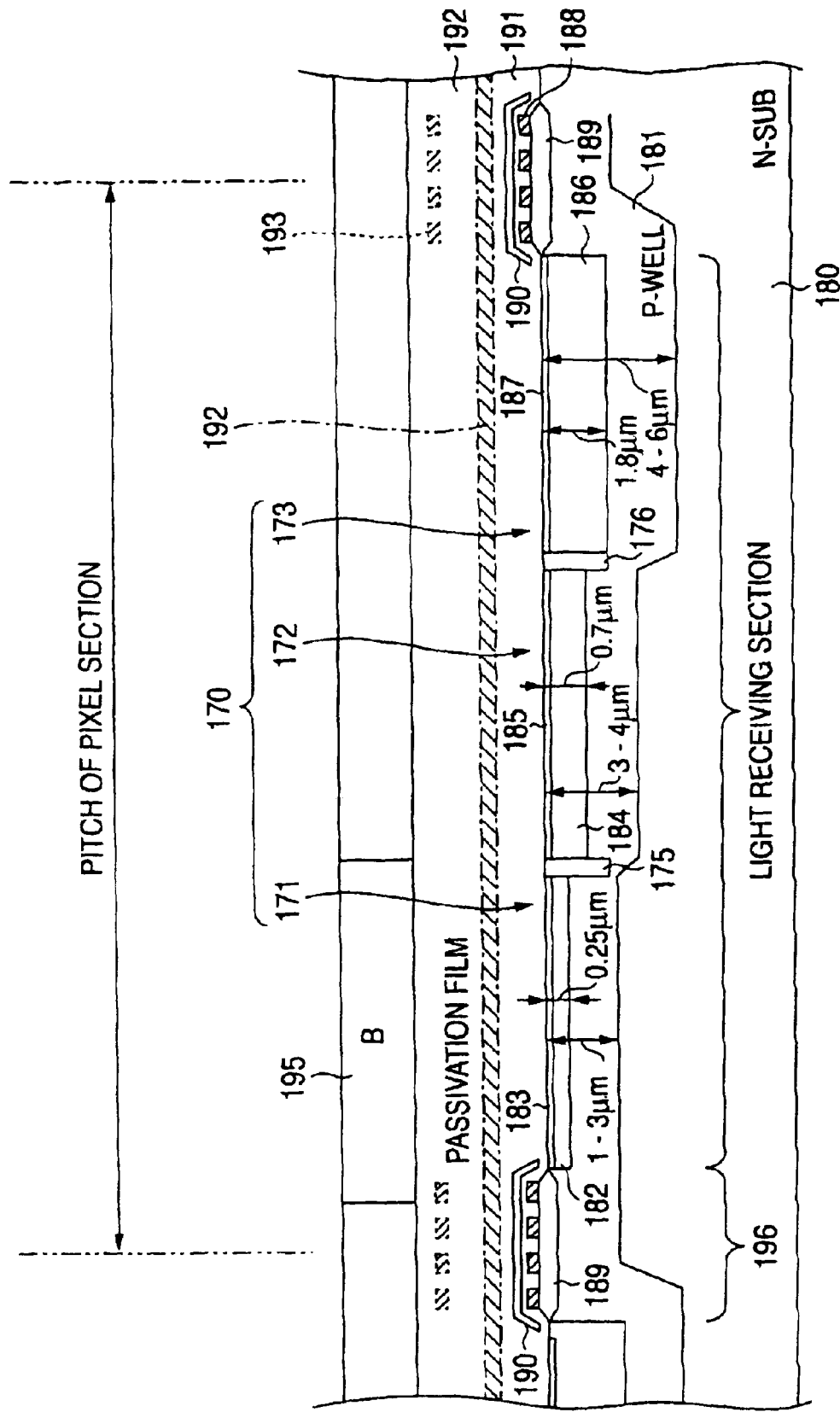
FIG. 35 is a cross-sectional view of one pixel section of a CMOS image sensor according to a seventh embodiment of the invention.

FIG. 35 is a cross-sectional view of a CMOS image sensor according to a eighteenth embodiment of the invention. The CMOS image sensor is basically identical in configuration with that of the seventeenth embodiment shown in FIG. 34. As shown in FIG. 35, the only difference between the sixth and seventh embodiments lies in that a color filter 195 of a blue (B) color is provided on the small pixel 171 having spectral sensitivity of a blue (B) color, thereby shaping the spectral characteristic B of the photodiode structure into a sharper waveform. When only one of the spectral characteristics of the R, G, and B colors has been made sharper, color reproducibility is improved further. A green color filter may also be provided on the small pixel 172.

Nineteenth Embodiment

Figure 36:
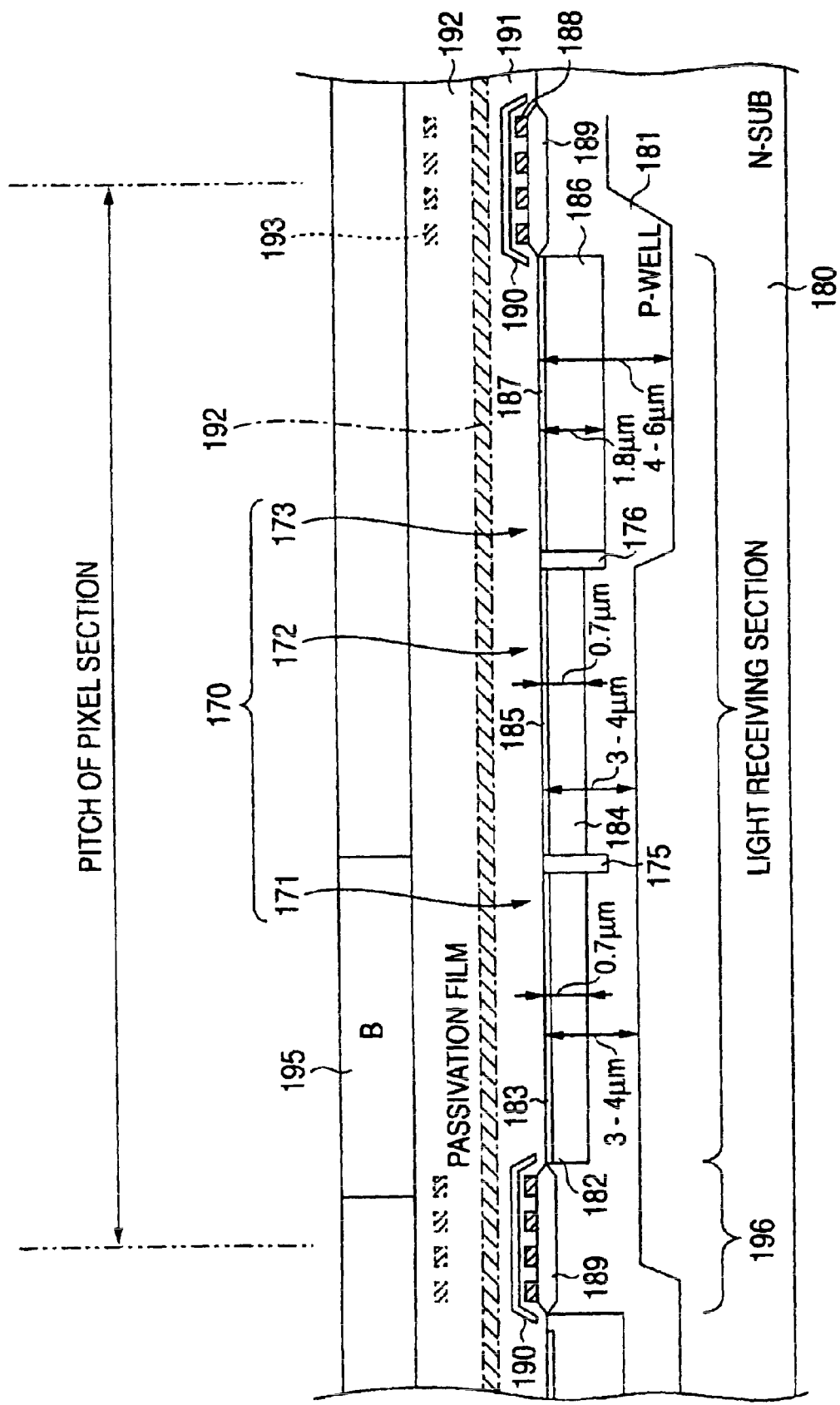
FIG. 36 is a cross-sectional view of one pixel section of a CMOS image sensor according to an eighth embodiment of the invention.

FIG. 36 is a cross-sectional view of a CMOS image sensor according to an nineteenth embodiment of the invention. The CMOS image sensor is basically identical with that of the eighteenth embodiment shown in FIG. 35. As shown in FIG. 36, the only difference between the eighteenth and nineteenth embodiments lies in that the diode structure of the small pixel 171 having B spectral sensitivity (e.g., the depth of the p-well layer 181 or the depth of the n-type impurity layer 82) is identical with that of the small pixel 172 having G spectral sensitivity. The photodiode structures of the small pixels 171, 172 are optimized so as to have the G spectral sensitivity.

Even when the photodiode structures of the small pixel 171 has been optimized so as to have the G spectral sensitivity, electric charges corresponding to the quantity of blue light are stored by means of the blue color filter 195. According to the embodiment, there is yielded an advantage of the ability to manufacture the small pixels 171, 172 so as to assume identical structures, thereby facilitating manufacturing processes.

The foregoing embodiments have been described by means of taking a CMOS image sensor as an example of the MOS image sensor. The present invention can also be applied to another type of an NMOS image sensor and a FMOS image sensor.

Twentieth Embodiment

Figure 37:
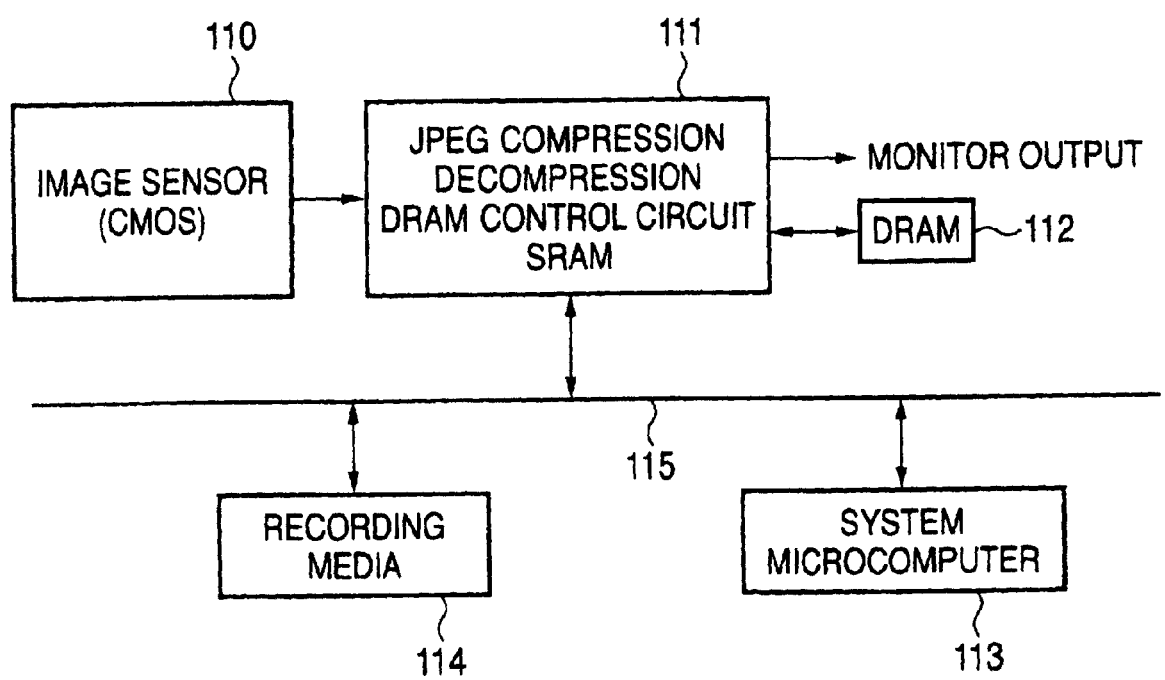
FIG. 37 is a block diagram of a digital camera according to an embodiment of the invention.
Figure 38:
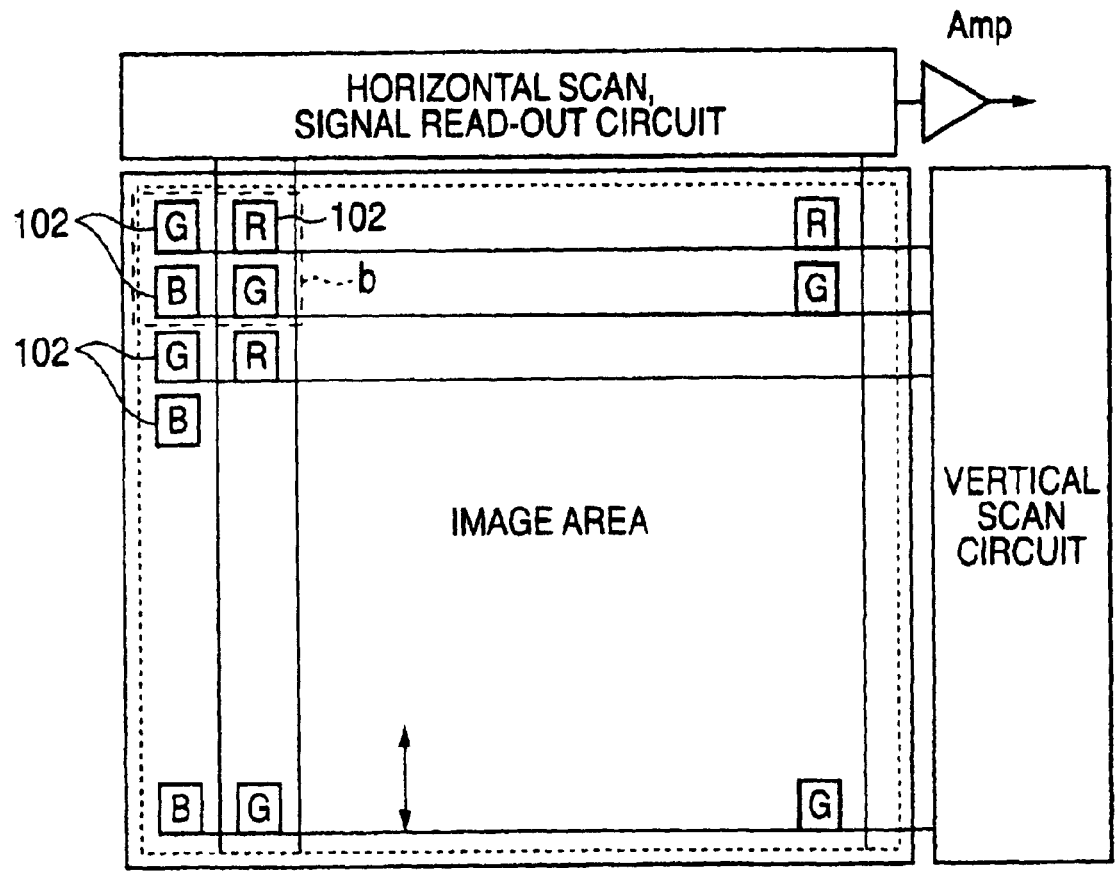
FIG. 38 is a block diagram of a related-art CMOS image sensor.
Figure 38:
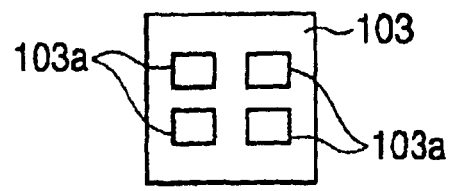
Figure 39:
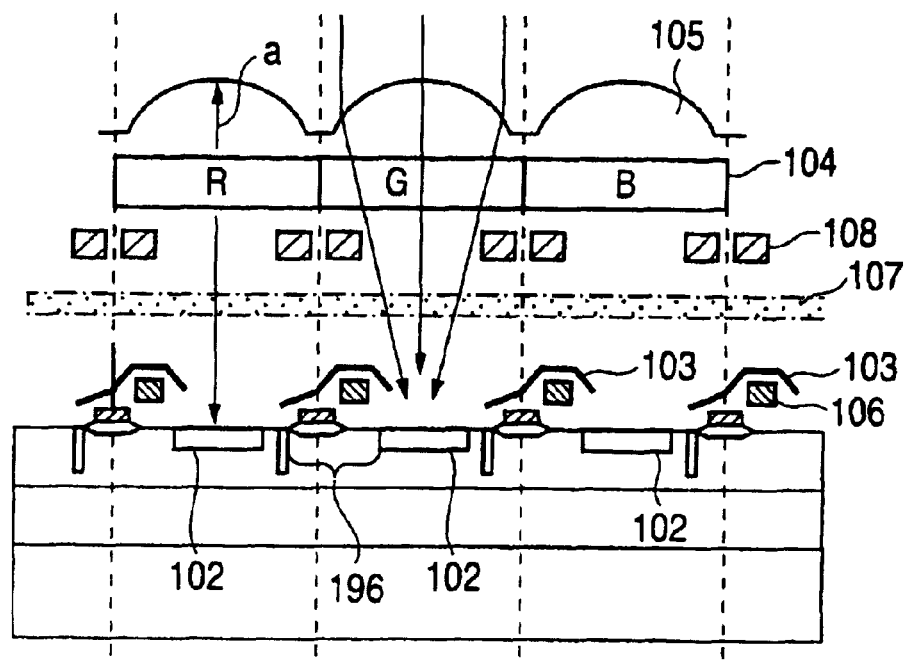
FIG. 39A is a cross-sectional view of the related-art CMOS image sensor.
FIG. 39B is a circuit diagram equivalent to respective pixel sections of the related-art CMOS image sensor.
Figure 39:
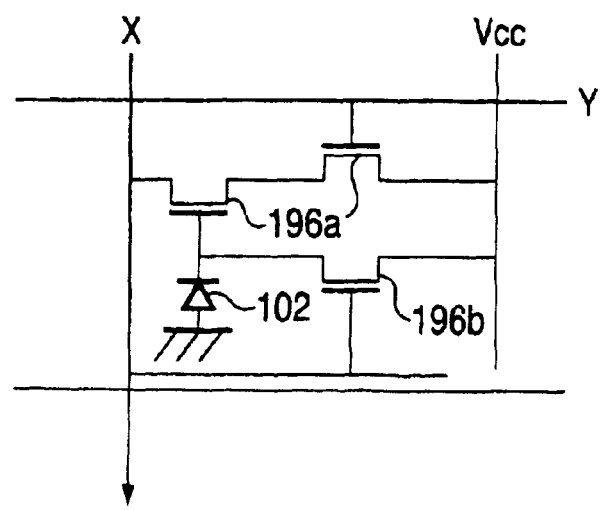

FIG. 37 is a block diagram of a digital camera equipped with the CMOS image sensor according to any one of the above-described embodiments. A digital camera, such as a digital still camera, a digital video camera, or a camera incorporated into a compact electronic device such as a portable cellular phone, comprises: a CMOS image sensor 110 which receives an optical signal of a subject's image formed by an unillustrated light-gathering optical system and converts the thus-received signal into an electrical signal; a digital processing circuit 111 which acquires a digital image signal output from the image sensor 110, to thereby effect JPEG compression or decompression or DRAM control; DRAM 112 connected to the digital processing circuit 11; a system microcomputer 113 for controlling the entire digital camera in a centralized manner; a recording medium 114 for recording photographed image data; and a bus 115 for interconnecting these constituent elements.

When the digital camera of the embodiment is equipped with, e.g., a CMOS image sensor shown in FIG. 31, solely detection signals of the small pixels 161, 162, and 163 are used for red, green, and blue signal components of the respective pixel sections 160, and the red, green, and blue signal components are not derived from the R, G, and B signals of an adjacent pixel section 160. As a result, processing load of the digital processing circuit 111 is alleviated, thereby enabling an attempt to speed up image processing.

The digital camera of the embodiment can photograph a high-sensitivity, high-resolution color image which enables faithful color reproduction while suppressing occurrence of a false signal (Moiré) and a false color, because of use of the CMOS image sensor having the foregoing structure.

According to the invention, there can be obtained a color solid-state image pickup device of single chip type which suppresses occurrence of a false signal (Moiré) and a false color and enables high-sensitivity, high-resolution, and faithful color reproduction.

The present invention also enables provision of an inexpensive MOS image sensor of single chip type and a digital camera which enables faithful color reproduction and realization of high sensitivity, a high resolution, a low voltage, and a driving operation involving lower power consumption while suppressing occurrence of a false signal (Moiré) and a false color. Further, The MOS image sensor of the invention bundles a plurality of signal lines and control lines, and those lines are provided around a pixel section (a photoelectric conversion area). Hence, there is yielded an advantage of prevention of inaccurate gathering of incident light on a small pixel, which would otherwise be caused by the signal lines and the control lines.

What is claimed is:

1. A color solid-state image pickup device including a plurality of photoelectric conversion areas provided in an array pattern on a surface of a semiconductor substrate, and a light-shielding film, wherein the inside of each of said photoelectric conversion areas is two-dimensionally partitioned into a plurality of segments which output a plurality of photoelectric conversion signals of different spectral sensitivities using transfer electrodes, wherein an aperture in said light-shielding film corresponds to at least two of said segments in one of said photoelectric conversion areas, and wherein the diameter or diagonal dimension of said aperture is smaller than the diameter or diagonal dimension of said one photoelectric conversion area, and is larger than a dimension of at least one segment, wherein said plurality of different spectral sensitivities include red, green and blue of primary colors, and the diameter or the diagonal dimension of each said aperture satisfies the formula $\lambda \leq t \leq 2\lambda$ wherein t represents the diameter or the diagonal dimension of said aperture and λ represents the wavelength 0.650 μm of a red color, and wherein a distance between two of said transfer electrodes is smaller than a distance across segments adjacent to said two transfer electrodes, the image pickup device further comprising an element isolation zone arranged between the segments in one photoelectric conversion area, wherein the transfer electrodes are formed so as to avoid said element isolation zone and to exist between said photoelectric conversion areas.

2. A color solid-state image pickup device including a plurality of photoelectric conversion areas provided in an array pattern on a surface of a semiconductor substrate, wherein an inside of each of said photoelectric conversion areas is two-dimensionally partitioned into a plurality of segments which store signal electric charges of different spectral sensitivities, a light-shielding film wherein an aperture in said light-shielding film corresponds to at least two of said segments in one of said photoelectric conversion areas, wherein said different spectral sensitivities include red, green and blue of primary colors, and the diameter or the diagonal dimension of said aperture satisfies the formula $\lambda \leq t \leq 2\lambda$ wherein t represents the diameter or the diagonal dimension of said aperture and λ represents the wavelength 0.650 82 m of a red color, and transfer channels, for transferring said signal electric charges read from a plurality of said segments, are formed beside said photoelectric conversion areas, said transfer channels extending along perimeters of said photoelectric conversion areas that are partitioned into said plurality of segments which store said signal electric charges of different spectral sensitivities, said transfer channels extending substantially parallel to said perimeters, the image pickup device further comprising an element isolation zone arranged between the segments in one photoelectric conversion area, wherein the transfer channels are formed so as to avoid said element isolation zone and to exist between said photoelectric conversion areas.

3. The color solid-state image pickup device according to claim 1, wherein the surface of said semiconductor substrate is covered with said light-shielding film having apertures corresponding to said respective photoelectric conversion areas.

4. The color solid-state image pickup device according to claim 3, wherein the diameter or diagonal dimension of said aperture is larger than the wavelength of incident light.

5. The color solid-state image pickup device according to claim 1, wherein the spectral sensitivity of at least one segment is determined by a color filter provided at a position above said segment.

6. The color solid-state image pickup device according to claim 1, wherein the spectral sensitivity of at least one segment of said photoelectric conversion area is determined by the distribution of impurities in a depthwise direction of said segment.

7. The color solid-state image pickup device according to claim 1, wherein the spectral sensitivity of at least one segment is determined by a color filter provided at a position above said segment as well as by the distribution of impurities in a depthwise direction of said segment.

8. The color solid-state image pickup device according to claim 6, wherein said segment has a p-well layer provided in an n-type semiconductor substrate, and an n-type impurity layer formed in said p-well layer, and the spectral sensitivity of said segment is determined by selecting the depth of the p-well layer and the depth of the n-type impurity layer.

9. The color solid-state image pickup device according to claim 8, wherein a p-well layer of said segment having blue spectral sensitivity, a p-well layer of said segment having green spectral sensitivity, and a p-well layer of said segment having red spectral sensitivity are formed so as to become progressively deeper, in this sequence.

10. The color solid-state image pickup device according to claim 8, wherein an n-type impurity layer provided in said p-well layer of said segment having blue spectral sensitivity, an n-type impurity layer provided in said p-well layer of said segment having green spectral sensitivity, and an n-type impurity layer provided in said p-well layer of said segment having red spectral sensitivity are formed so as to become progressively deeper, in this sequence.

11. The color solid-state image pickup device according to claim 1, wherein each of said photoelectric conversion areas is two-dimensionally partitioned into at least three segments, that is, a segment having red spectral sensitivity, a segment having green spectral sensitivity, and a segment having blue spectral sensitivity.

12. The color solid-state image pickup device according to claim 1, wherein each of said photoelectric conversion areas is two-dimensionally partitioned into at least four segments, that is, a segment having yellow spectral sensitivity, a segment having cyan spectral sensitivity, a segment having magenta spectral sensitivity, and a segment having green spectral sensitivity.

13. The color solid-state image pickup device according to claim 11, wherein each of said photoelectric conversion areas is two-dimensionally partitioned into at least four segments, that is, a segment having red spectral sensitivity, a segment having green spectral sensitivity, a segment having blue spectral sensitivity, and a segment having spectral sensitivity whose peak appears in the vicinity of a wavelength of 520 nm.

14. The color solid-state image pickup device according to claim 13, wherein processing is performed by means of a signal read from said segment having spectral sensitivity whose peak appears in the vicinity of a wavelength of 520 nm, thereby performing color reproduction analogous to a color matching function.

15. The color solid-state image pickup device according to claim 1, wherein arrangement of segments having the same spectral sensitivity differs from one photoelectric conversion area to an adjacent photoelectric conversion area.

16. The color solid-state image pickup device according to claim 1, wherein at least one of said segments in said photoelectric conversion areas differs in area from the other segments.

17. The color solid-state image pickup device according to claim 16, wherein areas of said segments in the photoelectric conversion areas are inversely proportional to the magnitude of relative spectral sensitivity per unit area of each segment.

18. The color solid-state image pickup device according to claim 1, wherein said color solid-state image pickup device is used for a digital camera.

19. A MOS image sensor having a plurality of photoelectric conversion areas provided in an array pattern on a surface of a semiconductor substrate, wherein an inside of each of said photoelectric conversion areas is two-dimensionally partitioned into a plurality of segments which output photoelectric conversion signals having a plurality of different spectral sensitivities, a light-shielding film wherein an aperture in said light-shielding film corresponds to at least two of said segments in one of said photoelectric conversion areas, wherein said plurality of different spectral sensitivities include red, green and blue of primary colors, and the diameter or the diagonal dimension of each said aperture satisfies the formula $\lambda \leq t \leq 2\lambda$ wherein t represents the diameter or the diagonal dimension of said aperture and $\lambda$ represents the wavelength 0.650 μm of a red color, peripheral circuits connected to said segments are arranged around said photoelectric conversion areas, along perimeters of said photoelectric conversion areas, and transfer channels, for transferring signal electric charges read from a plurality of said segments, are formed beside said photoelectric conversion areas, said transfer channels extending along perimeters of said photoelectric conversion areas and substantially parallel to said perimeters, the image sensor further comprising an element isolation zone arranged between the segments in one photoelectric conversion area, wherein the transfer channels are formed so as to avoid said element isolation zone and to exist between said photoelectric conversion areas.

20. The MOS image sensor according to claim 19, wherein the surface of said semiconductor substrate is covered with a light-shielding film having apertures assigned to said respective photoelectric conversion areas.

21. The MOS image sensor according to claim 20, wherein the diameter or diagonal dimension of said aperture is larger than the wavelength of incident light and smaller than the diameter or diagonal dimension of said photoelectric conversion area.

22. The MOS image sensor according to claim 20, wherein one microlens is provided so as to correspond to one aperture.

23. The MOS image sensor according to claim 19, wherein photoelectric conversion signals are sequentially read from respective segments into which said photoelectric conversion area is two-dimensionally partitioned.

24. The MOS image sensor according to claim 23, wherein the photoelectric conversion signals read from said respective segments are output to a common signal line.

25. The MOS image sensor according to claim 19, wherein the spectral sensitivity of at least one segment is determined by a color filter provided above said segment.

26. The MOS image sensor according to claim 19, wherein the spectral sensitivity of at least one segment of said photoelectric conversion areas is determined by the distribution of impurities in a depthwise direction of said segment.

27. The MOS image sensor according to claim 19, wherein the spectral sensitivity of at least one segment is determined by a color filter disposed above said segment and the distribution of impurities in a depthwise direction of said segment.

28. The MOS image sensor according to claim 26, wherein said segment has a p-well layer provided on an n-type semiconductor substrate, and an n-type impurity layer formed on said p-well layer, and the spectral sensitivity of said segment is determined by selecting the depth of said p-well layer and the depth of said n-type impurity layer.

29. The MOS image sensor according to claim 28, wherein the depth of an n-type impurity layer of said segment having blue spectral sensitivity, the depth of an n-type impurity layer of said segment having green spectral sensitivity, and the depth of an n-type impurity layer of said segment having red spectral sensitivity are made progressively deeper, in this sequence.

30. The MOS image sensor according to claim 28, wherein the depth of a p-well layer of said segment having blue spectral sensitivity, the depth of a p-well layer of said segment having green spectral sensitivity, and the depth of a p-well layer of said segment having red spectral sensitivity are made progressively deeper, in this sequence.

31. The MOS image sensor according to claim 19, wherein said individual photoelectric conversion area is two-dimensionally partitioned into at least three segments; i.e., a segment having red spectral sensitivity, a segment having green spectral sensitivity, and a segment having blue spectral sensitivity.

32. The MOS image sensor according to claim 19, wherein said individual photoelectric conversion area is two-dimensionally partitioned into at least four segments; i.e., a segment having yellow spectral sensitivity, a segment having cyan spectral sensitivity, a segment having magenta spectral sensitivity, and a segment having green spectral sensitivity.

33. The MOS image sensor according to claim 19, wherein said individual photoelectric conversion area is two-dimensionally partitioned into at least four segments; i.e., a segment having red spectral sensitivity, a segment having green spectral sensitivity, a segment having blue spectral sensitivity, and a segment having spectral sensitivity whose peak appears in the vicinity of a wavelength of 520 nm.

34. The MOS image sensor according to claim 33, wherein processing is performed by use of a signal read from said segment having spectral sensitivity whose peak appears in the vicinity of a wavelength of 520 nm, to thus perform color representation analogous to a color matching function.

35. The MOS image sensor according to claim 19, further comprising segments which have equivalent spectral sensitivity and are arranged in a different pattern, at a position between said adjacent photoelectric conversion areas.

36. The MOS image sensor according to claim 19, wherein the area of at least one segment of said segments within the photoelectric conversion areas differs from that of another segment.

37. The MOS image sensor according to claim 36, wherein the area of each segment in the photoelectric conversion areas is inversely proportional to the magnitude of relative spectral sensitivity per unit area of said segment.

38. The MOS image sensor according to claim 19, wherein the image sensor is of passive type.

39. The MOS image sensor according to claim 19, wherein the image sensor is of active type.

40. The MOS image sensor according to claim 19, wherein said MOS image sensor is used for a digital camera.

41. The color solid-state image pickup device according to claim 1, wherein said array pattern is arranged by offsetting odd lines from even lines by half a pitch.

42. The MOS image sensor according to claim 19, wherein said array pattern is arranged in a grid pattern.

43. An image pickup device including image capturing means for outputting a plurality of photoelectric conversion signals of different spectral sensitivities using transfer electrodes, wherein said image capturing means includes a plurality of photoelectric conversion areas provided in an array pattern on a surface of a semiconductor substrate, an inside of each of said photoelectric conversion areas being two-dimensionally partitioned into a plurality of segments which output a plurality of photoelectric conversion signals of different spectral sensitivities, and light-shielding means, wherein an aperture in said light-shielding means corresponds to at least two of said segments in one of said photoelectric conversion areas, and the diameter or diagonal dimension of said aperture is smaller than the diameter or diagonal dimension of said one photoelectric conversion area, and is larger than a dimension of at least one segment, and wherein said plurality of different spectral sensitivities include red, green and blue of primary colors, and the diameter or the diagonal dimension of each said aperture satisfies the formula $\lambda \leq t \leq 2\lambda$ wherein t represents the diameter or the diagonal dimension of said aperture and $\lambda$ represents the wavelength 0.650 μm of a red color, and wherein a distance between two of said transfer electrodes is smaller than a distance across segments adjacent to said two transfer electrodes, the image pickup device further comprising an element isolation zone arranged between the segments in one photoelectric conversion area, wherein the transfer electrodes are formed so as to avoid said element isolation zone and to exist between said photoelectric conversion areas.

44. An image pickup device for outputting a plurality of photoelectric conversion signals of different spectral sensitivities comprising:

signal storing means for storing electric charges of different spectral sensitivities in a plurality of segments which are partitioned by dividing an inside of a plurality of photoelectric conversion areas being formed in an array pattern on a surface of a semiconductor substrate, a light-shielding film wherein an aperture in said light-shielding film corresponds to at least two of said segments in one of said photoelectric conversion areas, wherein said different spectral sensitivities include red, green and blue of primary colors, and the diameter or the diagonal dimension of each said aperture satisfies the formula $\lambda \leq t \leq 2\lambda$ wherein t represents the diameter or the diagonal dimension of said aperture and $\lambda$ represents the wavelength 0.650 μm of a red color, and signal transfer means for transferring said electric charges read from a plurality of said segments through channels being formed beside said photoelectric conversion areas, said channels extending along perimeters of said photoelectric conversion areas and substantially parallel to said perimeters, the image pickup device further comprising an element isolation zone arranged between the segments in one photoelectric conversion area, wherein the channels are formed so as to avoid said element isolation zone and to exist between said photoelectric conversion areas.

45. The color solid-state image pickup device according to claim 2, wherein the surface of said semiconductor substrate is covered with a light-shielding film having apertures corresponding to said respective photoelectric conversion areas.

46. The color solid-state image pickup device according to claim 45, wherein the diameter or diagonal dimension of said aperture is larger than the wavelength of incident light and smaller than the diameter or diagonal dimension of said photoelectric conversion area.

47. The color solid-state image pickup device according to claim 2, wherein the transfer channel extends, between the photoelectric conversion areas, along the perimeters of the photoelectric conversion areas.

48. The MOS image sensor according to claim 19, wherein the transfer channel extends, between the photoelectric conversion areas, along the perimeters of the photoelectric conversion areas.

49. The image pickup device according to claim 44, wherein the transfer channel extends, between the photoelectric conversion areas, along the perimeters of the photoelectric conversion areas.

* * * * *